(12) United States Patent
Kim

(10) Patent No.: US 11,670,719 B2
(45) Date of Patent: Jun. 6, 2023

(54) SEMICONDUCTOR DEVICE HAVING UPPER CHANNEL AND LOWER CHANNEL AND METHOD OF MANUFACTURING THE SAME

(71) Applicant: SAMSUNG ELECTRONICS CO., LTD., Suwon-si (KR)

(72) Inventor: Sungmin Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 74 days.

(21) Appl. No.: 17/126,260

(22) Filed: Dec. 18, 2020

(65) Prior Publication Data

US 2022/0020880 A1 Jan. 20, 2022

(30) Foreign Application Priority Data

Jul. 15, 2020 (KR) .................... 10-2020-0087513

(51) Int. Cl.

| | | |
|---|---|---|
| *H01L 29/78* | (2006.01) | |
| *H01L 27/12* | (2006.01) | |
| *H01L 29/66* | (2006.01) | |
| *H01L 29/06* | (2006.01) | |
| *H01L 29/423* | (2006.01) | |
| *H01L 29/36* | (2006.01) | |
| *H01L 21/84* | (2006.01) | |

(52) U.S. Cl.
CPC ........ *H01L 29/7856* (2013.01); *H01L 21/845* (2013.01); *H01L 27/1211* (2013.01); *H01L 29/0653* (2013.01); *H01L 29/42376* (2013.01); *H01L 29/6653* (2013.01); *H01L 29/6681* (2013.01); *H01L 29/66553* (2013.01); *H01L 29/36* (2013.01)

(58) Field of Classification Search
CPC ............. H01L 29/7856; H01L 29/0653; H01L 29/42376; H01L 29/6653; H01L 29/66553; H01L 29/6681; H01L 29/36
See application file for complete search history.

(56) References Cited

U.S. PATENT DOCUMENTS

| | | |
|---|---|---|
| 7,514,325 B2 | 4/2009 | Kim et al. |
| 9,583,598 B2 | 2/2017 | Lee et al. |
| 9,633,891 B2 | 4/2017 | Collaert et al. |
| 9,773,705 B2 | 9/2017 | Ching et al. |
| 10,211,322 B1 | 2/2019 | Kim et al. |

(Continued)

FOREIGN PATENT DOCUMENTS

KR 10-0616230 B1 8/2006

*Primary Examiner* — Christine A Enad
(74) *Attorney, Agent, or Firm* — Lee IP Law, P.C.

(57) ABSTRACT

A semiconductor device and a method of manufacturing a semiconductor device, the device including a first semiconductor pattern on a substrate, the first semiconductor pattern including a lower channel; a second semiconductor pattern on the first semiconductor pattern and spaced apart from the first semiconductor pattern in a vertical direction, the second semiconductor pattern including an upper channel extending in the vertical direction; a gate electrode covering the lower channel and surrounding the upper channel; and source/drain patterns on opposite sides of the upper channel, wherein the substrate and the first semiconductor pattern have a doping concentration of $10^{19}/cm^3$ or less.

19 Claims, 32 Drawing Sheets

(56) References Cited

U.S. PATENT DOCUMENTS

| | | | |
|---|---|---|---|
| 2016/0056156 A1* | 2/2016 | Ghani | H01L 29/0847 |
| | | | 438/283 |
| 2018/0277543 A1* | 9/2018 | Kim | H01L 29/785 |
| 2019/0245098 A1 | 8/2019 | Ramaswamy et al. | |
| 2021/0083056 A1* | 3/2021 | Lin | H01L 29/1054 |
| 2021/0134795 A1* | 5/2021 | Ju | H01L 29/0673 |

* cited by examiner

SEMICONDUCTOR DEVICE HAVING UPPER CHANNEL AND LOWER CHANNEL AND METHOD OF MANUFACTURING THE SAME

CROSS-REFERENCE TO THE RELATED APPLICATION

Korean Patent Application No. 10-2020-0087513, filed on Jul. 15, 2020, in the Korean Intellectual Property Office, and entitled: "Semiconductor Device Having Upper Channel and Lower Channel and Method of Manufacturing the Same," is incorporated by reference herein in its entirety.

BACKGROUND

1. Field

Embodiments relate to a semiconductor device having an upper channel and a lower channel and a method of manufacturing the same.

2. Description of the Related Art

With the demand for high integration and size reduction of semiconductor devices, the size of transistors in semiconductor devices has been reduced.

SUMMARY

The embodiments may be realized by providing a semiconductor device including a first semiconductor pattern on a substrate, the first semiconductor pattern including a lower channel; a second semiconductor pattern on the first semiconductor pattern and spaced apart from the first semiconductor pattern in a vertical direction, the second semiconductor pattern including an upper channel extending in the vertical direction; a gate electrode covering the lower channel and surrounding the upper channel; and source/drain patterns on opposite sides of the upper channel, wherein the substrate and the first semiconductor pattern have a doping concentration of $10^{19}/cm^3$ or less.

The embodiments may be realized by providing a semiconductor device including a first semiconductor pattern on a substrate, the first semiconductor pattern including an extension pattern protruding from an upper surface of the substrate and a lower channel on the extension pattern; a semiconductor oxide layer between the extension pattern and the lower channel; a device isolation layer covering the substrate and the semiconductor oxide layer; a second semiconductor pattern on the first semiconductor pattern and spaced apart from the first semiconductor pattern in a vertical direction, the second semiconductor pattern including an upper channel extending in the vertical direction; a gate electrode covering the lower channel and surrounding the upper channel; a gate capping layer covering the gate electrode; and source/drain patterns on opposite sides of the upper channel, wherein the substrate and the first semiconductor pattern have a doping concentration of $10^{19}/cm^3$ or less.

The embodiments may be realized by providing a method of manufacturing a semiconductor device, the method including forming an active pattern including a first semiconductor pattern on a substrate, a sacrificial pattern on the first semiconductor pattern, and a second semiconductor pattern on the sacrificial pattern, the active pattern extending in a first horizontal direction; forming a preliminary gate pattern extending in a second horizontal direction, intersecting the first horizontal direction, across the active pattern; forming a cavity by removing a portion of the sacrificial pattern that does not overlap the preliminary gate pattern in a vertical direction; forming an insulating pattern filling the cavity and gate spacers covering a sidewall of the preliminary gate pattern; forming source/drain patterns on the second semiconductor pattern; and replacing the preliminary gate pattern with a gate electrode, wherein the substrate and the first semiconductor pattern have a doping concentration of $10^{19}/cm^3$ or less.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
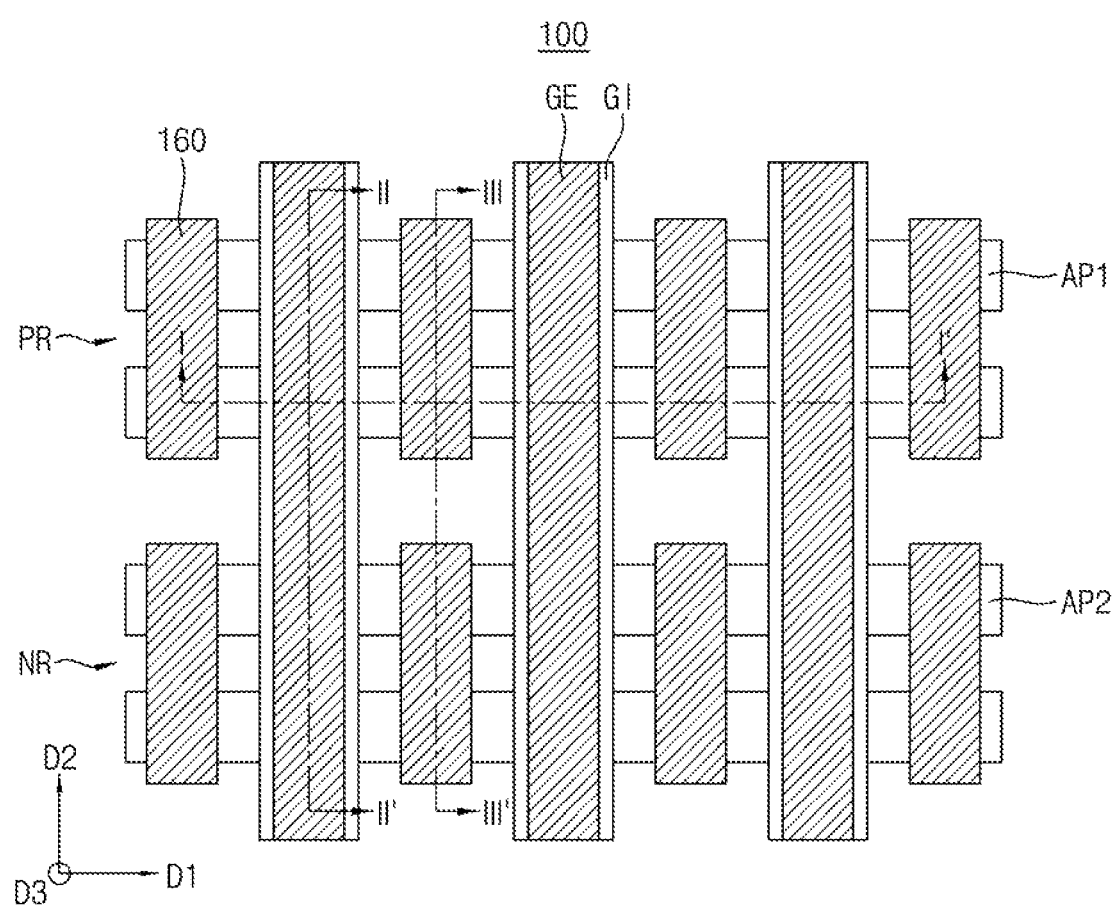
FIG. 1 is a plan view of a semiconductor device according to an example embodiment.
Figure 2:
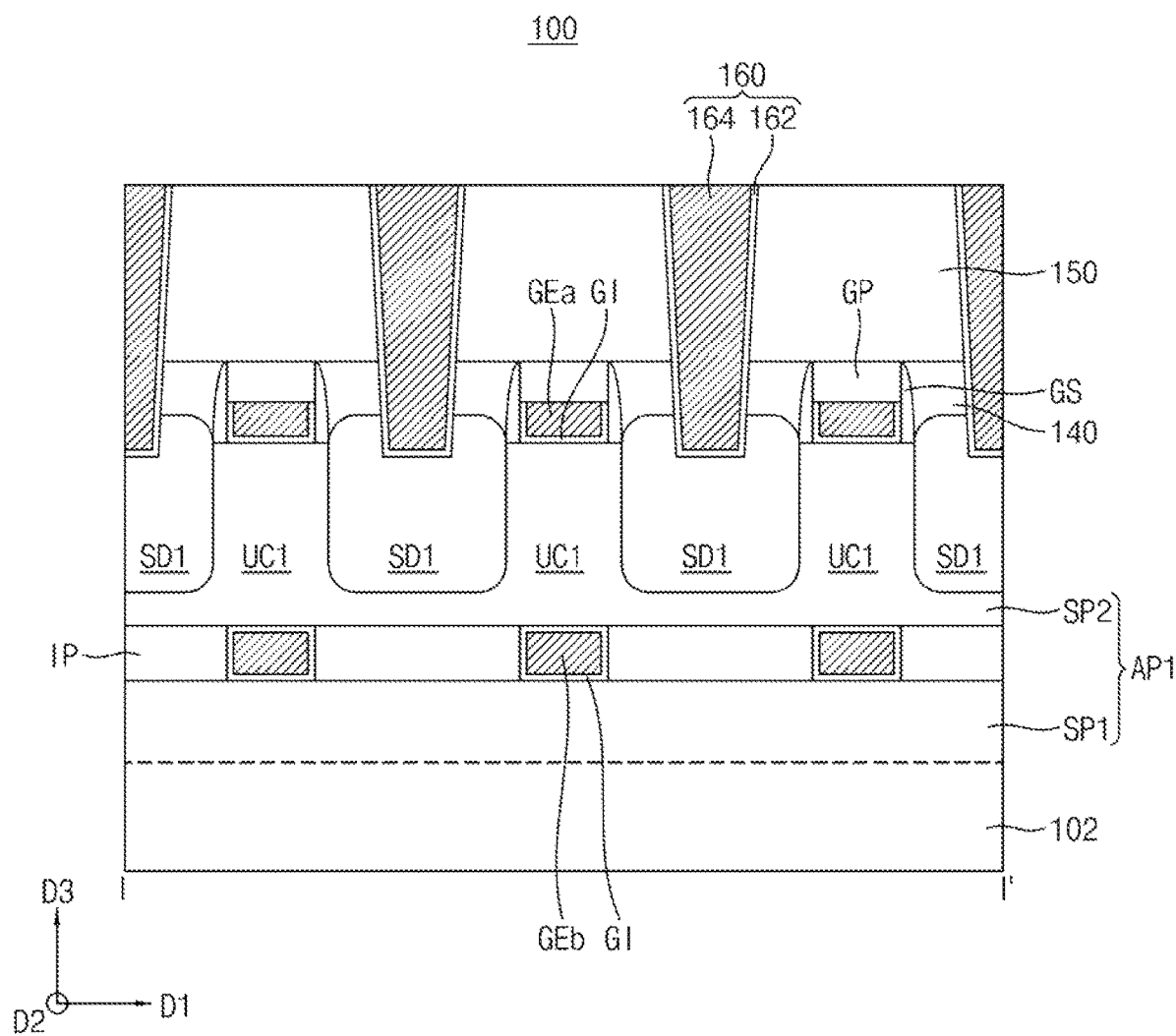
FIG. 2 is a cross-sectional view of the semiconductor device of FIG. 1 taken along line I-I'.
Figure 3:
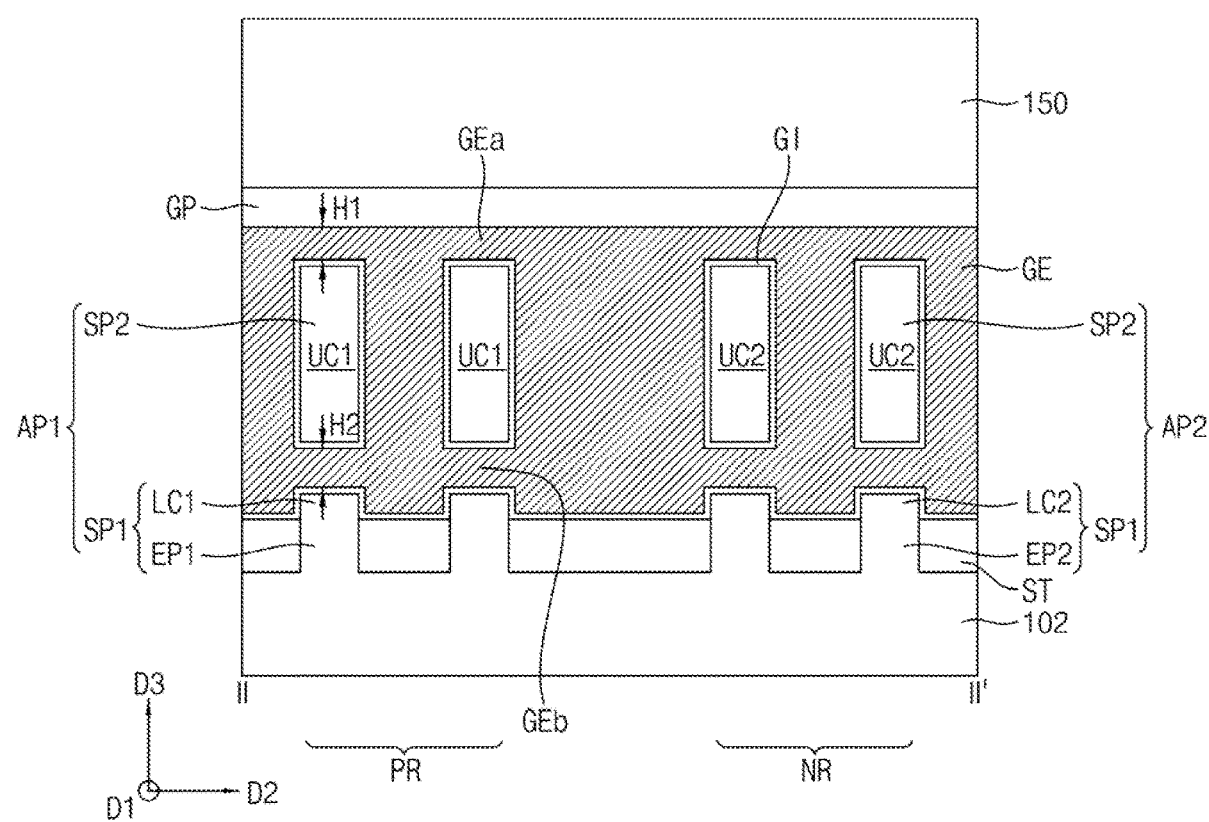
FIG. 3 is a cross-sectional view of the semiconductor device of FIG. 1 taken along line II-II'.
Figure 4:
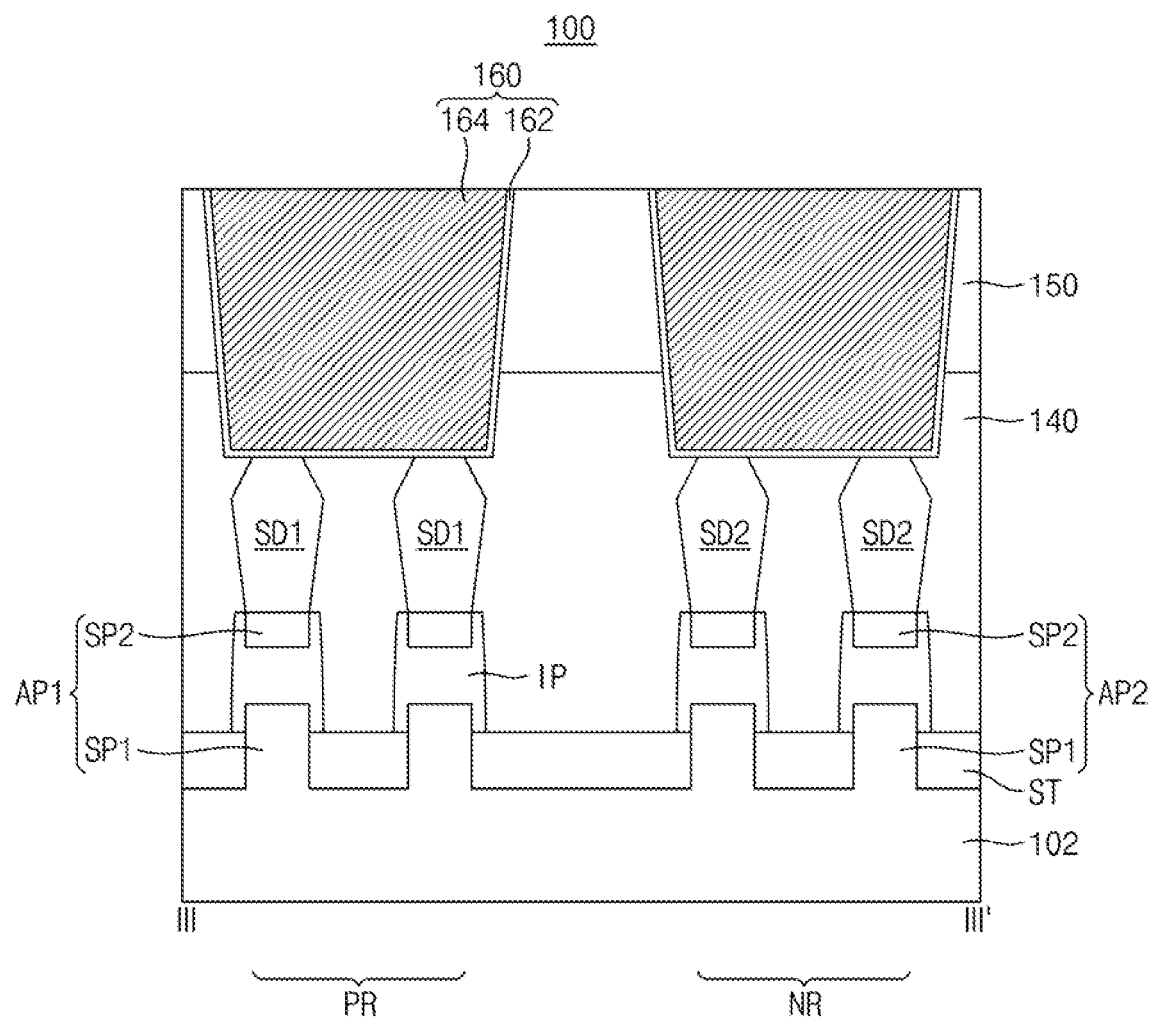
FIG. 4 is a cross-sectional view of the semiconductor device of FIG. 1 taken along line III-III'.

FIG. 1 is a plan view of a semiconductor device according to an example embodiment. FIG. 2 is a cross-sectional view of the semiconductor device of FIG. 1 taken along line I-I'. FIG. 3 is a cross-sectional view of the semiconductor device of FIG. 1 taken along line II-III'. FIG. 4 is a cross-sectional view of the semiconductor device of FIG. 1 taken along line III-III'.

A semiconductor device 100 according to an example embodiment of the disclosure may include a PMOSFET region PR and an NMOSFET region NR. The semiconductor device 100 may be a gate all-around field effect transistor (GAAFET). The PMOSFET region PR and the NMOSFET region NR may be logic cell regions in which logic transistors constituting the logic circuit of the semiconductor device 100 are disposed. In an implementation, logic transistors constituting a processor core or an I/O terminal may be on a logic cell region. The PMOSFET region PR and the NMOSFET region NR may include some of the logic transistors.

In an implementation, the PMOSFET region PR and the NMOSFET region NR may constitute a memory cell region for storing data. In an implementation, memory cell transistors constituting a plurality of SRAM cells may be on the memory cell region. In an implementation, the PMOSFET region PR and the NMOSFET region NR may include some of the memory cell transistors.

Referring to FIGS. 1 to 4, the semiconductor device 100 may include a substrate 102, a device isolation layer ST, a first active pattern AP1, a second active pattern AP2, a first source/drain pattern SD1, a second source/drain pattern SD2, gate electrodes GE, insulating patterns IP, a first interlayer insulating layer 140, a second interlayer insulating layer 150, and a contact 160.

The substrate 102 may include a semiconductor material. In an implementation, the substrate 102 may be a silicon substrate, a germanium substrate, or a silicon-germanium substrate. In an implementation, the substrate may include a Group IV semiconductor, a Group III-V compound semiconductor, or a Group II-VI oxide semiconductor.

The device isolation layer ST may cover the upper surface of the substrate 102. The device isolation layer ST may be formed relatively deeply between the PMOSFET region PR and the NMOSFET region NR. The device isolation layer ST may define the PMOSFET region PR and the NMOSFET region NR.

The first active pattern AP1 and the second active pattern AP2 may be on the substrate 102. The first active pattern AP1 may be in the PMOSFET region PR, and the second active pattern AP2 may be in the NMOSFET region NR. The first active pattern AP1 and the second active pattern AP2 may extend in a first horizontal direction D1. The first active patterns AP1 and the second active patterns AP2 may be spaced apart from each other in a second horizontal direction D2.

Each of the first active pattern AP1 and the second active pattern AP2 may include a first semiconductor pattern SP1 and a second semiconductor pattern SP2. The first semiconductor pattern SP1 may protrude from the upper surface of the substrate 102, and may be a part of the substrate 102. The first semiconductor pattern SP1 may include a first extension pattern EP1 and a first lower channel LC1 in the PMOSFET region PR, and may further include a second extension pattern EP2 and a second lower channel LC2 in the NMOSFET region NR. The first extension pattern EP1 and the second extension pattern EP2 may respectively be parts of the first semiconductor pattern SP1 and the second semiconductor pattern SP2 that are covered by the device isolation layer ST. The first lower channel LC1 and the second lower channel LC2 may be respectively positioned on the first extension pattern EP1 and the second extension pattern EP2. The upper surfaces of the first lower channel LC1 and the second lower channel LC2 may be positioned at a higher level than the upper surface of the device isolation layer ST.

The second semiconductor pattern SP2 may be on the first semiconductor pattern SP1, and may be spaced apart from the first semiconductor pattern SP1 in a vertical direction (e.g., D3). The second semiconductor pattern SP2 may include a first upper channel UC1 in the PMOSFET region PR and a second upper channel UC2 in the NMOSFET region NR. The first upper channel UC1 and the second upper channel UC2 may protrude (e.g., heightwise) in the vertical direction D3. The first semiconductor pattern SP1 and the second semiconductor pattern SP2 may include the same material as the substrate 102. In an implementation, the first semiconductor pattern SP1 and the second semiconductor pattern SP2 may include a Group IV semiconductor, a Group III-V compound semiconductor, or a Group II-VI oxide semiconductor.

In an implementation, at least one of the substrate 102, the first semiconductor pattern SP1, and the upper channels UC1 and UC2 may not be intentionally doped. In an implementation, at least one of the substrate 102, the first semiconductor pattern SP1, and the upper channels UC1 and UC2 may have a doping concentration of $10^{19}/cm^3$ or less. Artificial doping may include doping using ion implantation or ion diffusion. In an implementation, the substrate 102 and the first semiconductor pattern SP1 may have a doping concentration of $10^{19}/cm^3$ or less. In an implementation, all of the substrate 102, the first semiconductor pattern SP1, and the upper channels UC1 and UC2 may have a doping concentration of $10^{19}/cm^3$ or less. The substrate 102 and the first semiconductor pattern SP1 may not be doped, and the occurrence of parasitic capacitance may be prevented or reduced when the device operates. In an implementation, it is possible to improve the performance of the device by reducing an RC delay.

The first source/drain pattern SD1 and the second source/drain pattern SD2 may be on the second semiconductor pattern SP2. The first source/drain pattern SD1 and the second source/drain pattern SD2 may be formed from the second semiconductor pattern SP2 through a selective epitaxial growth (SEG) process. The first source/drain pattern SD1 may be between the first upper channels UC1 in the PMOSFET region PR, and may include a p-type impurity. The second source/drain pattern SD2 may be between the second upper channels UC2 in the NMOSFET region NR, and may include an n-type impurity. The upper surfaces of the first source/drain pattern SD1 and the second source/drain pattern SD2 may be respectively positioned at a higher level than (e.g., farther from the substrate 102 in the vertical direction D3 than) the upper surfaces of the first upper channel UC1 and the second upper channel UC2.

The gate electrodes GE may cross the first active pattern AP1 and the second active pattern AP2, and may extend (e.g., lengthwise) in the second horizontal direction D2. The gate electrodes GE may be spaced apart from each other in the first horizontal direction D1. The gate electrodes GE may surround the first upper channel UC1 and the second upper channel UC2, and may cover the upper surfaces of the first lower channel LC1 and the second lower channel LC2. In a plan view, the gate electrodes GE may intersect the first active pattern AP1 and the second active pattern AP2. The gate electrodes GE may include an upper intersection GEa and a lower intersection GEb. The upper intersection GEa and the lower intersection GEb may refer to the parts of the gate electrodes GE that overlap the first active pattern AP1 or the second active pattern AP2 in the vertical direction D3. In an implementation, the upper intersection GEa may include parts of the gate electrodes GE between the first upper channel UC1 or the second upper channel UC2 and a gate capping layer GP (e.g., in the vertical direction D3). The lower intersection GEb may include parts of the gate electrodes GE between the first lower channel LC1 and the first upper channel UC1 or between the second lower channel LC2 and the second upper channel UC2 (e.g., in the vertical direction D3).

The semiconductor device 100 may include gate spacers GS, a gate insulating layer GI, and a gate capping layer GP. The gate spacers GS may cover both sidewalls of each gate electrode GE, and may extend in the second horizontal direction D2. In an implementation, the gate spacer GS may be composed of one or more layers.

The gate insulating layer GI may surround the first upper channel UC1 and the second upper channel UC2. In an implementation, the gate insulating layer GI may cover the device isolation layer ST, the first lower channel LC1, and the second lower channel LC2, and may be between the gate electrode GE and the gate spacers GS.

The gate capping layer GP may cover the upper surface of the gate electrode GE. The upper surface of the gate capping layer GP may be positioned at the same level as (e.g., the same distance from the substrate 102 in the vertical direction D3 as) the upper ends of the gate spacers GS. The lower surface of the gate capping layer GP may be positioned at a higher level than the upper surfaces of the first upper channel UC1 and the second upper channel UC2. A height H1 (in the vertical direction D3) of the gate electrode GE between the gate capping layer GP and the first upper channel UC1 (e.g., a height of the upper intersection GEa) may be less than a height H2 (in the vertical direction D3) of the gate electrode GE between the first upper channel UC1 and the first lower channel LC1 (e.g., a height of the lower intersection GEb). In an implementation, the height of the gate electrode GE between the gate capping layer GP and the second upper channel UC2 may be less than the height of the gate electrode GE between the second upper channel UC2 and the second lower channel LC2. In an implementation, a thickness or height of the gate electrode GE between the gate capping layer GP and the first and second upper channels UC1 and UC2 (e.g., in the vertical direction D3) may be 50 nm or less. Parasitic capacitance between the gate electrode GE and the contact 160 may be reduced by limiting the height of the gate electrode GE, thereby improving the operation speed of the device.

The semiconductor device 100 may include insulating patterns IP. The insulating patterns IP may be between the first semiconductor pattern SP1 and the second semiconductor pattern SP2, and may be spaced apart from each other in the first horizontal direction D1. The gate electrode GE may be between the insulating patterns IP. In an implementation, the insulating pattern IP may not overlap the gate electrode GE in the vertical direction, and may overlap the first source/drain pattern SD1 and the second source/drain pattern SD2 in the vertical direction. The insulating patterns IP may partially cover the side surfaces of the first semiconductor pattern SP1 and the second semiconductor pattern SP2 and the upper surface of the device isolation layer ST. The insulating pattern IP may electrically insulate the first semiconductor pattern SP1 from the second semiconductor pattern SP2.

The first interlayer insulating layer 140 may be on the substrate 102. The first interlayer insulating layer 140 may cover the insulating pattern IP, the first source/drain pattern SD1, and the second source/drain pattern SD2. An upper surface of the first interlayer insulating layer 140 may be coplanar with the upper surface of the gate capping layer GP. The second interlayer insulating layer 150 may be on the first interlayer insulating layer 140. The second interlayer insulating layer 150 may cover the first interlayer insulating layer 140 and the gate capping layer GP.

In a plan view, the contacts 160 may be between the gate electrodes GE, and may overlap the first active pattern AP1 or the second active pattern AP2. In an implementation, each contact 160 may extend (e.g., lengthwise) in the second horizontal direction D2 over two first active patterns AP1 or two second active patterns AP2. In a longitudinal cross-sectional view, the contacts 160 may vertically penetrate the first interlayer insulating layer 140 and the second interlayer insulating layer 150. In an implementation, the contacts 160 may extend from the upper surface of the second interlayer insulating layer 150 in the vertical direction to be connected to the first source/drain pattern SD1 and the second source/drain pattern SD2. The upper surfaces of the contacts 160 may be coplanar with the upper surface of the second interlayer insulating layer 150, and the lower surfaces of the contacts 160 may be positioned at a lower level than the upper surfaces of the first source/drain pattern SD1 and the second source/drain pattern SD2. The contacts 160 may include a barrier layer 162 and a conductive layer 164. The barrier layer 162 may cover the bottom and side surfaces of the contacts 160, and the conductive layer 164 may be disposed on the barrier layer 162.

FIGS. 5 to 27 are plan views and cross-sectional views of stages in a method of manufacturing a semiconductor device according to an example embodiment. FIGS. 6, 9, 12, 14, 17, 19, 21, 24 and 26 are cross-sectional views taken along line I-I' of FIG. 5. FIGS. 7, 10, 15, 22, 25 and 27 are cross-sectional views taken along line II-II' of FIG. 5. FIGS. 8, 11, 13, 16, 18, 20 and 23 are cross-sectional views taken along line III-III' of FIG. 5.

Figure 5:
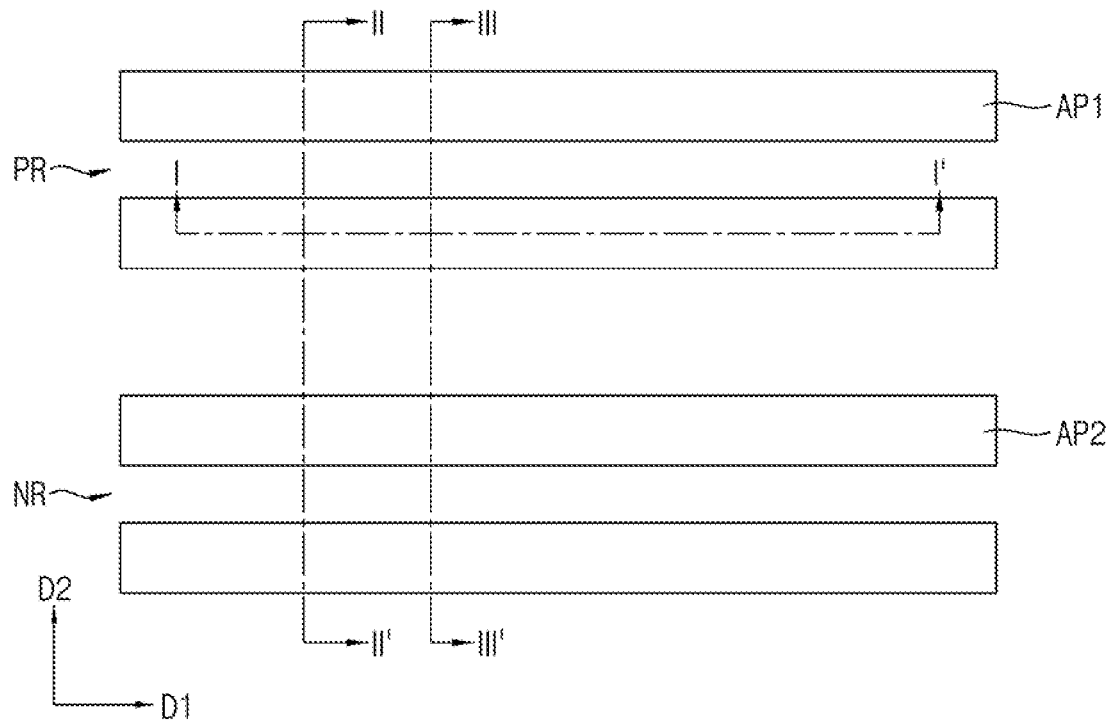
FIGS. 5 to 27 are plan views and cross-sectional views of stages in a method of manufacturing a semiconductor device according to an example embodiment.
Figure 6:
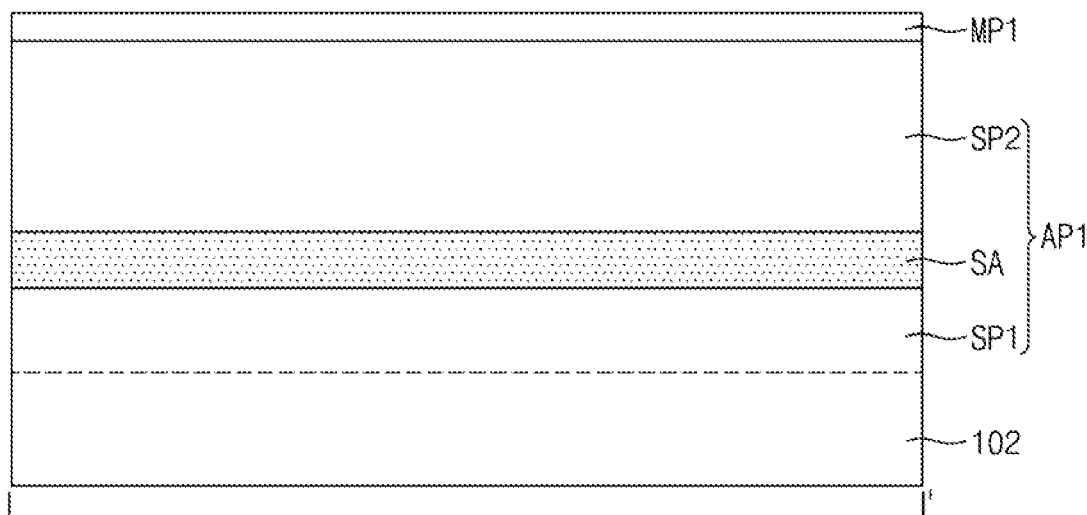

FIG. 5 is a layout of a first active pattern AP1 and a second active pattern AP2.

Referring to FIGS. 5 to 8, a substrate 102, a first active pattern AP1, a second active pattern AP2, a first mask pattern M1, and a device isolation layer ST may be formed. The substrate 102 may include a semiconductor material. In an implementation, the substrate 102 may be a silicon substrate, a germanium substrate, or a silicon-germanium substrate. In an implementation, the substrate 102 may include a Group IV semiconductor, a Group III-V compound semiconductor, or a Group II-VI oxide semiconductor.

The first active pattern AP1 and the second active pattern AP2 may extend in the first horizontal direction D1. The first active pattern AP1 and the second active pattern AP2 may be spaced apart from each other in the second horizontal direction D2. The first active pattern AP1 may be in a PMOSFET region PR, and the second active pattern AP2 may be in an NMOSFET region NR.

The first active pattern AP1 and the second active pattern AP2 may protrude from the upper surface of the substrate 102 (e.g., in the vertical direction D3). The first active pattern AP1 and the second active pattern AP2 may include a first semiconductor pattern SP1, a sacrificial pattern SA, and a second semiconductor pattern SP2, which are sequentially stacked. A first mask pattern MP1 may be on the first active pattern AP1 and the second active pattern AP2. Forming the first active pattern AP1 and the second active pattern AP2 may include performing a selective epitaxial growth process using the substrate 102 as a seed to form a semiconductor layer and a sacrificial layer and patterning the epitaxially grown semiconductor layer and the epitaxially grown sacrificial layer using the first mask pattern MP1 as an etch mask. In an implementation, the first semiconductor pattern SP1 and the second semiconductor pattern SP2 may include the same material as the substrate 102. The sacrificial pattern SA may include a material having etch selectivity with respect to the first semiconductor pattern SP1 and the second semiconductor pattern SP2. In an implementation, the sacrificial pattern SA may include SiGe.

The device isolation layer ST may cover the upper surface of the substrate 102. In an implementation, the device isolation layer ST may be formed relatively deeply between the PMOSFET region PR and the NMOSFET region NR. The upper surface of the device isolation layer ST may be positioned at a lower level than the upper surface of the first semiconductor pattern SP1. In an implementation, the device isolation layer ST may include silicon oxide.

Figure 9:
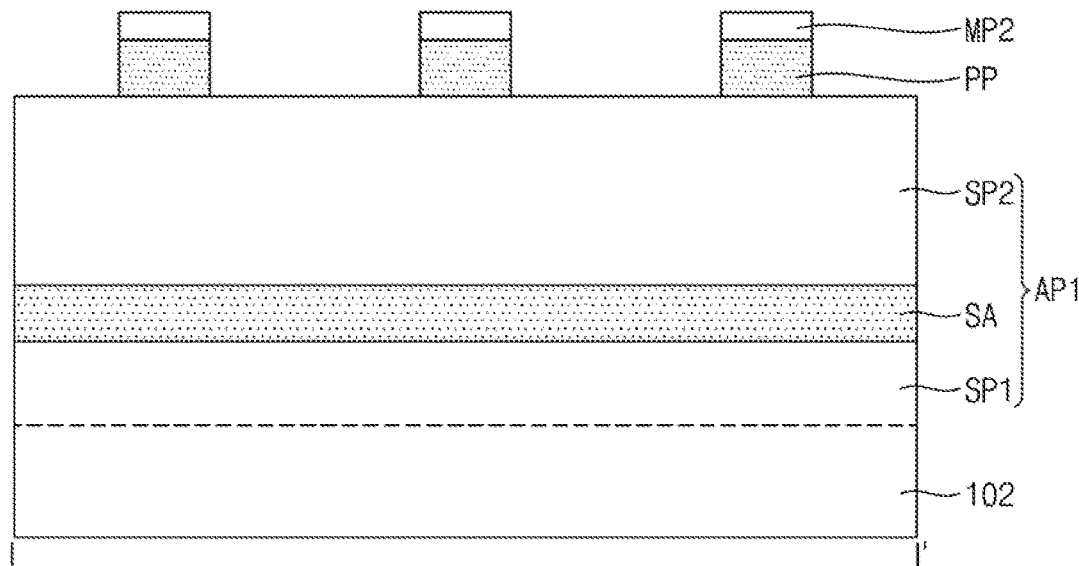
Figure 10:
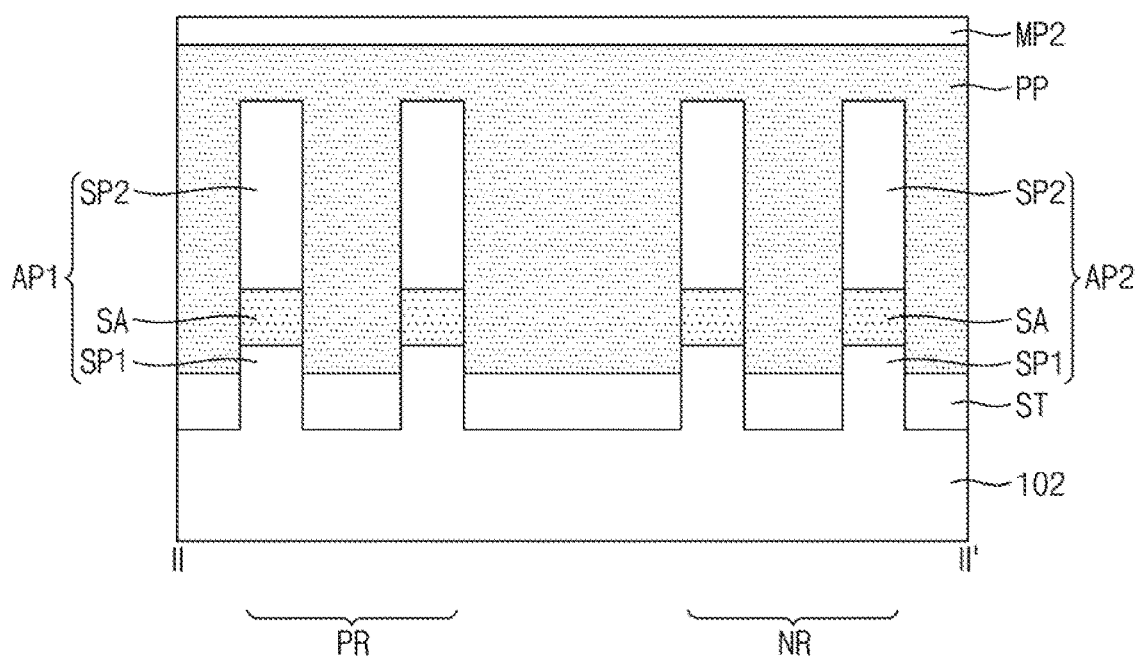
Figure 11:
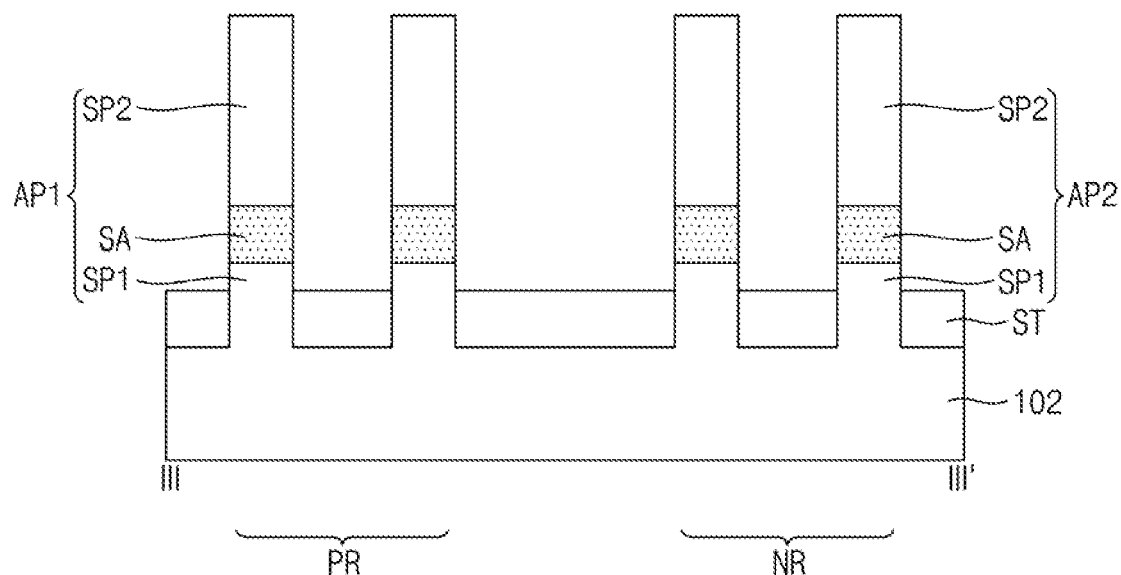

Referring to FIGS. 9 to 11, the first mask pattern MP1 may be removed, and a preliminary gate pattern PP and a second mask pattern MP2 may be formed. The preliminary gate pattern PP may extend in the second horizontal direction D2 across the first active pattern AP1 and the second active pattern AP2. The second mask pattern MP2 may be on the preliminary gate pattern PP. Forming the preliminary gate pattern PP and the second mask pattern MP2 may include forming a preliminary gate layer, forming a mask layer on the preliminary gate layer, and patterning the preliminary gate layer using the mask layer as an etch mask. The preliminary gate pattern PP may include polysilicon.

Figure 12:
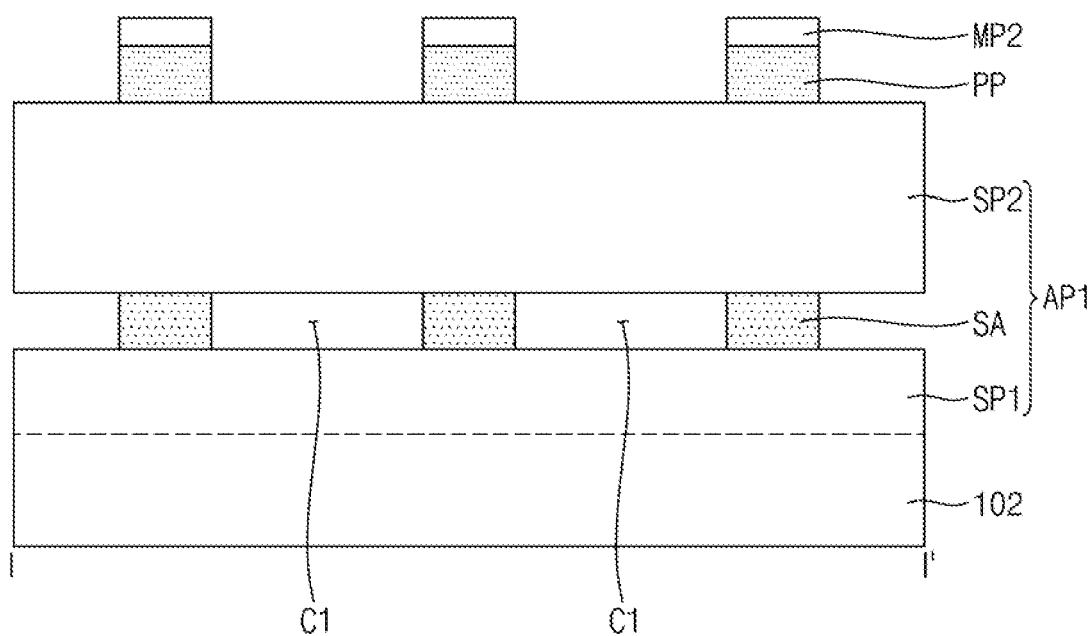
Figure 13:
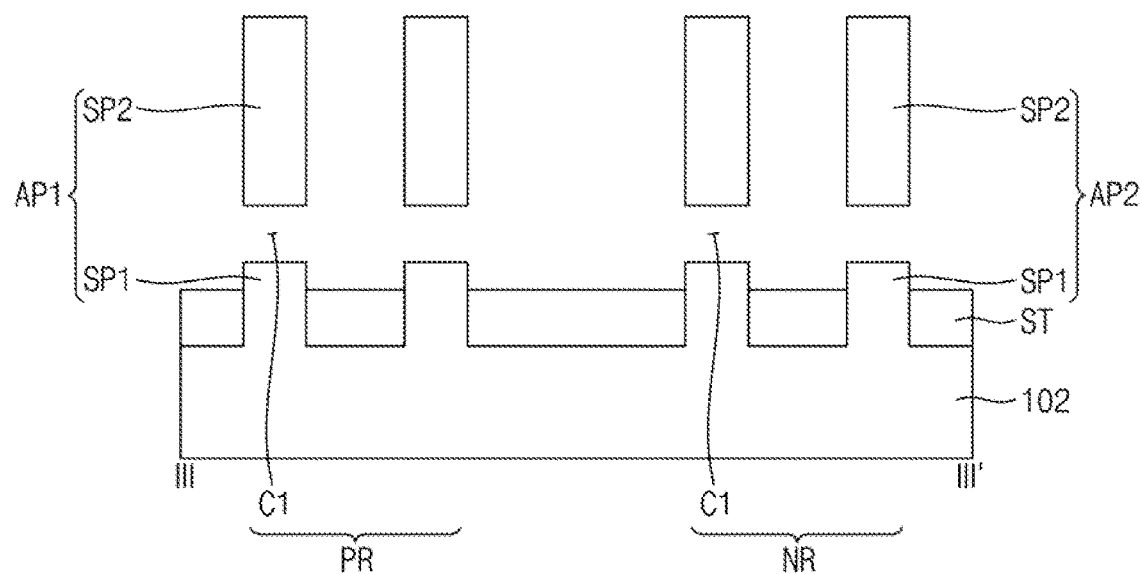

Referring to FIGS. 12 and 13, the sacrificial pattern SA may be partially removed. The sacrificial pattern SA may be removed through an anisotropic etching process, and the first semiconductor pattern SP1 and the second semiconductor pattern SP2 may not be removed. The sacrificial pattern SA may be removed to form a first cavity C1 between the first semiconductor pattern SP1 and the second semiconductor pattern SP2. In an implementation, a portion of the sacrificial pattern SA, which overlaps the preliminary gate pattern PP in the vertical direction, may not be removed. In an implementation, a width of the unremoved sacrificial pattern SA in the first horizontal direction D1 may be less than the width of the preliminary gate pattern PP. As illustrated in FIG. 2, the width of the lower intersection GEb in the first horizontal direction D1 may vary depending on the width of the sacrificial pattern SA in the first horizontal direction D1.

Figure 14:
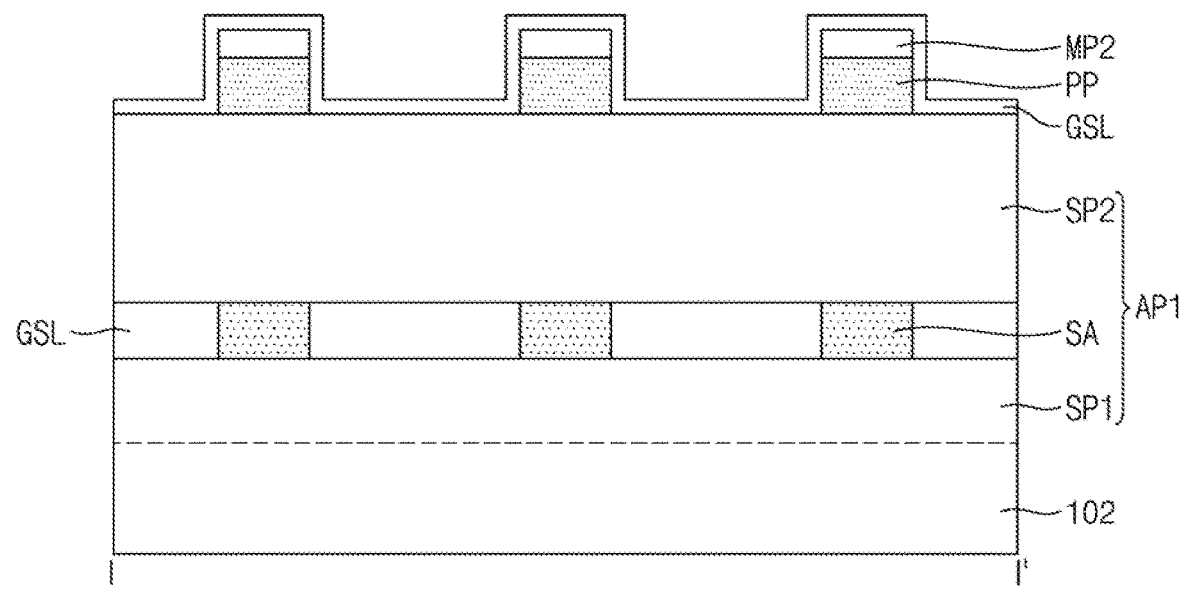
Figure 15:
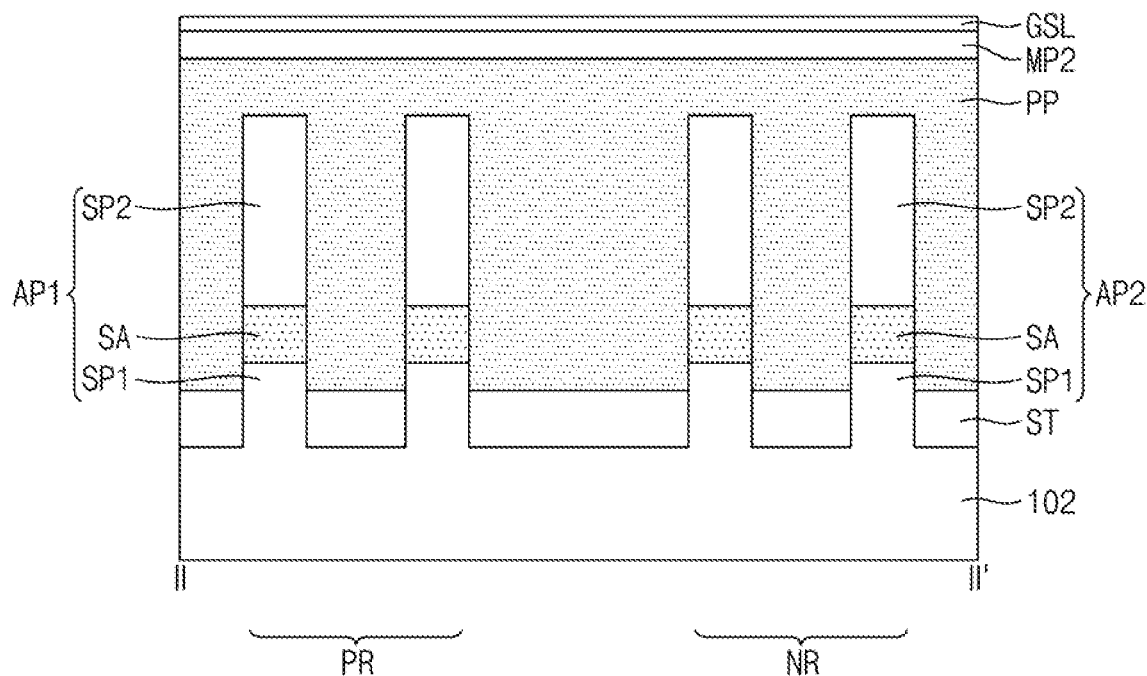
Figure 16:
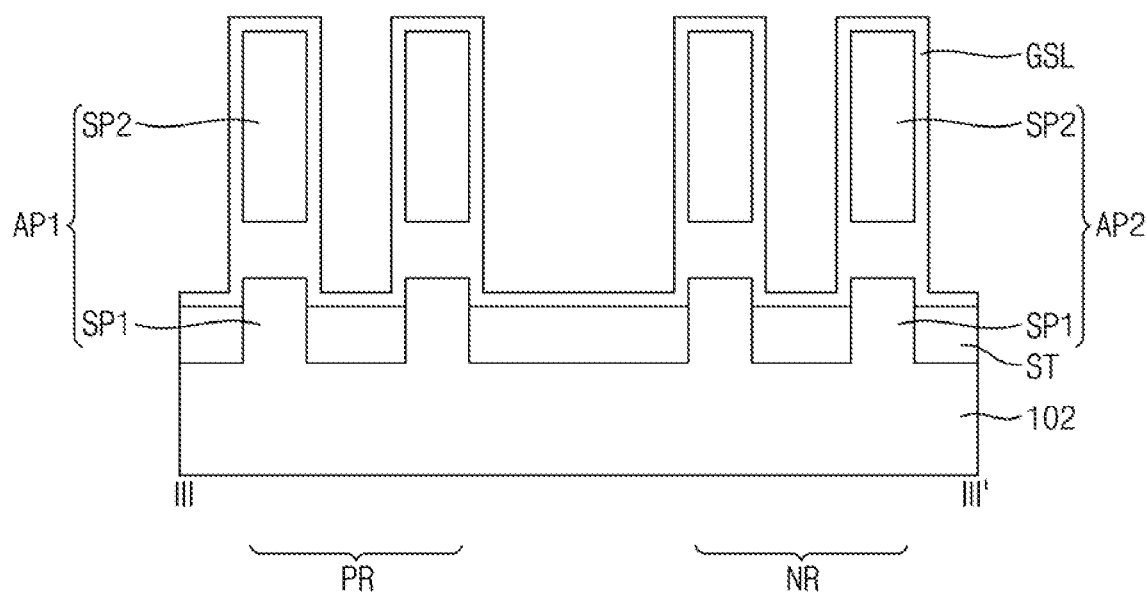

Referring to FIGS. 14 to 16, a gate spacer layer GSL may be formed on the results of the processing shown in FIGS. 12 and 13. The gate spacer layer GSL may cover the device isolation layer ST, the first semiconductor pattern SP1, the second semiconductor pattern SP2, the preliminary gate pattern PP, and the second mask pattern MP2. In an implementation, the gate spacer layer GSL may fill the first cavity C1 between the first semiconductor pattern SP1 and the second semiconductor pattern SP2. The gate spacer layer GSL may include silicon nitride.

Figure 17:
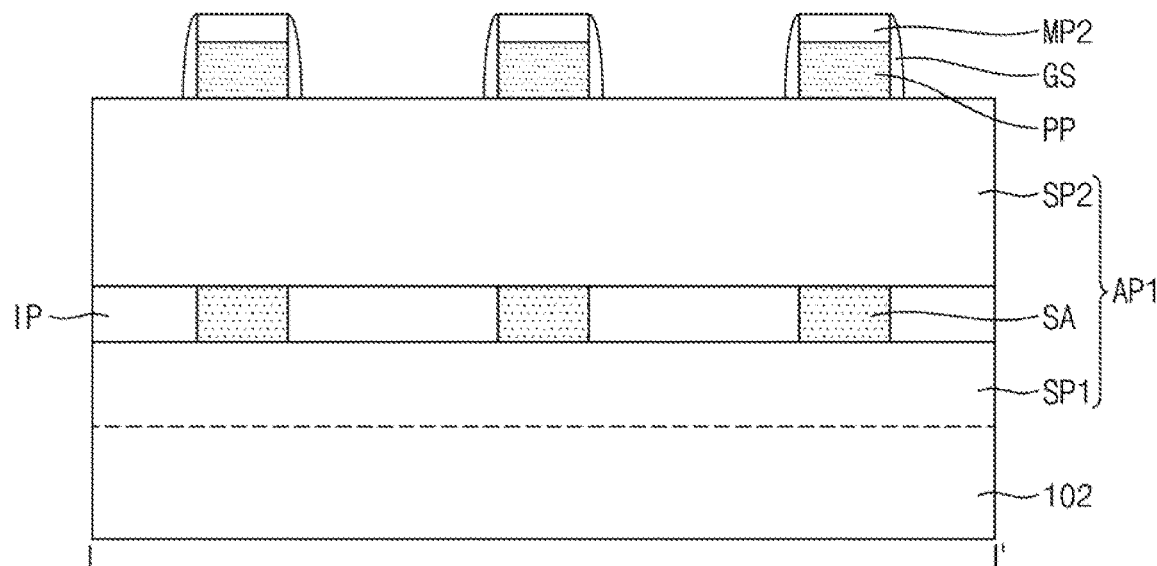
Figure 18:
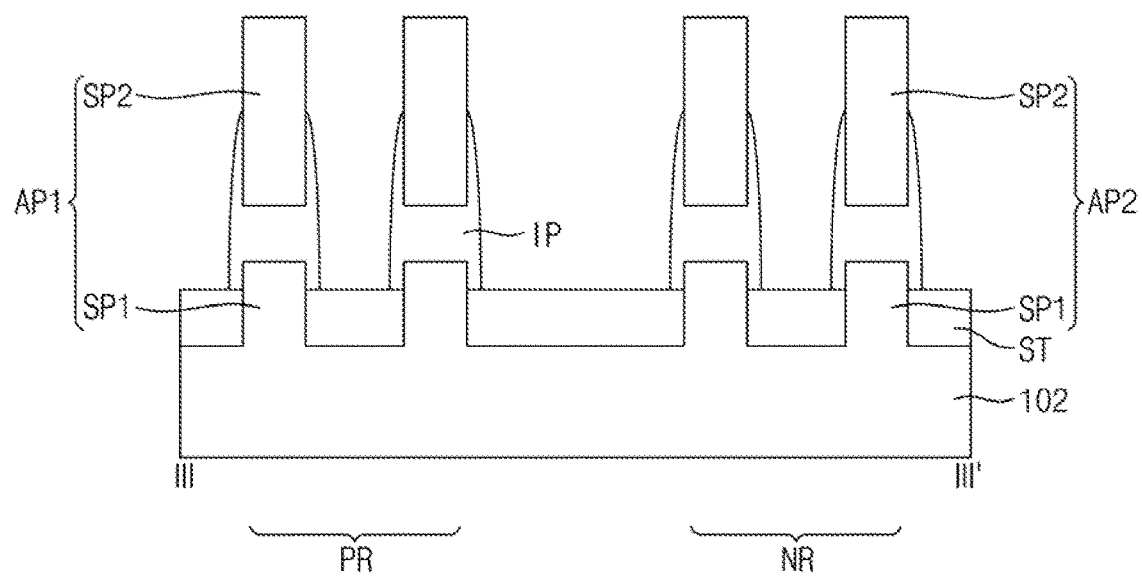

Referring to FIGS. 17 and 18, a gate spacer GS and an insulating pattern IP may be formed. The gate spacer GS and the insulating pattern IP may be formed by anisotropically etching the gate spacer layer GSL. The gate spacer layer GSL may be etched to expose the device isolation layer ST and the second semiconductor pattern SP2. The gate spacers GS may cover both side surfaces of the preliminary gate pattern PP and the second mask pattern MP2, and may extend in the second horizontal direction D2. The insulating pattern IP may fill the first cavity C1 between the first semiconductor pattern SP1 and the second semiconductor pattern SP2, and may partially cover the side surfaces of the first semiconductor pattern SP1 and the second semiconductor pattern SP2.

Figure 19:
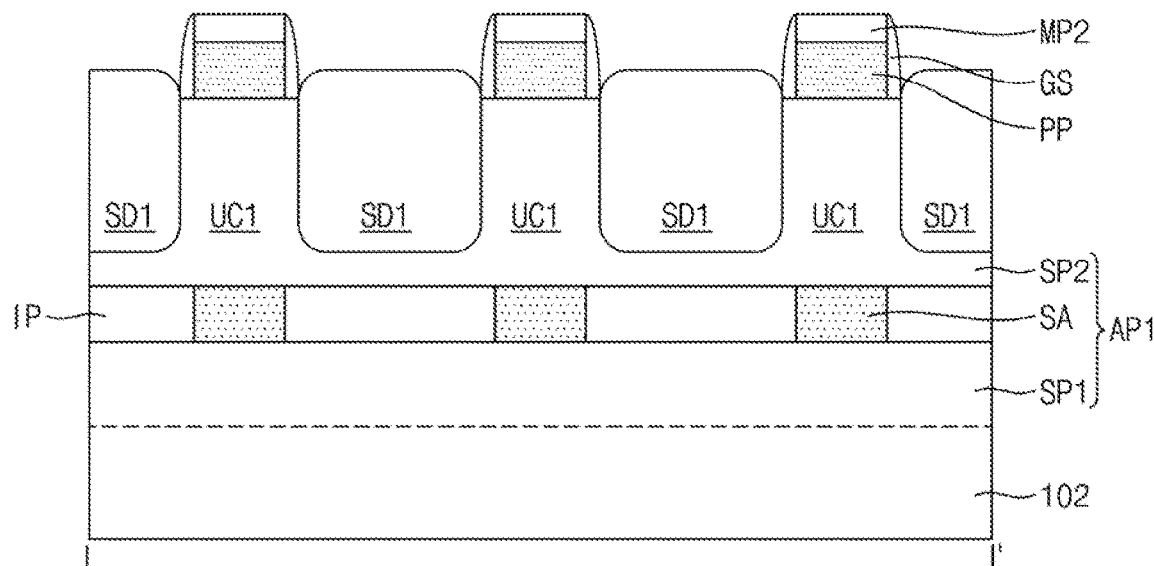
Figure 20:
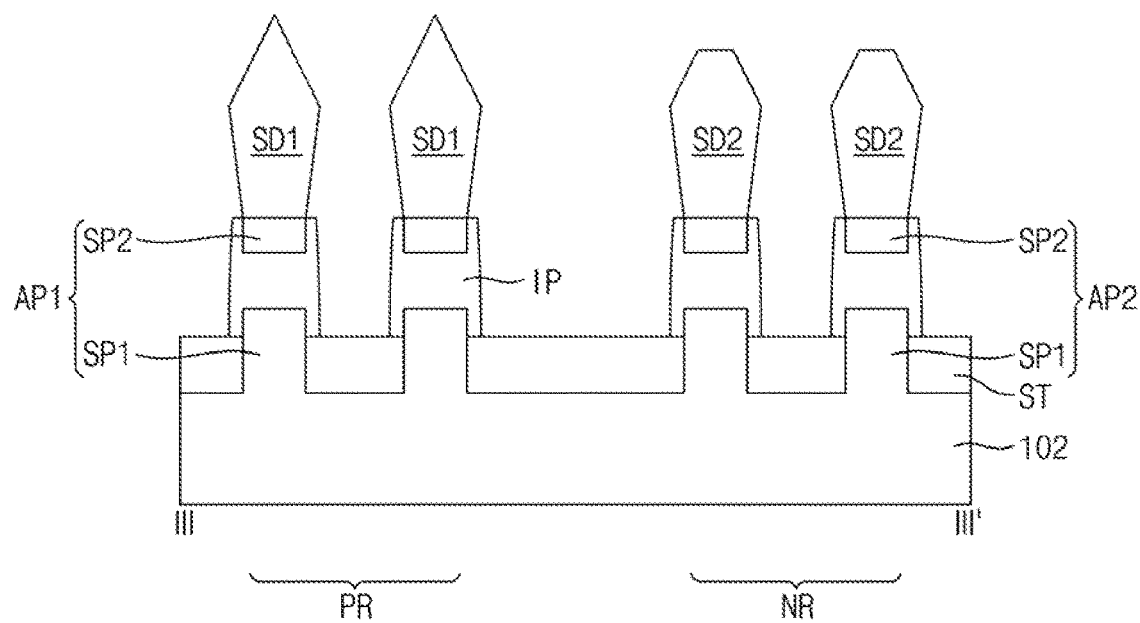

Referring to FIGS. 19 and 20, a first source/drain pattern SD1 and a second source/drain pattern SD2 may be formed. The first source/drain pattern SD1 and the second source/drain pattern SD2 may be on the side surfaces of the preliminary gate pattern PP. Forming the first source/drain pattern SD1 and the second source/drain pattern SD2 may include partially removing the upper surface of the second semiconductor pattern SP2 and performing a selective epitaxial growth process using the second semiconductor pattern SP2 as a seed. The first source/drain pattern SD1 and the second source/drain pattern SD2 may fill the removed portion of the second semiconductor pattern SP2. The first source/drain pattern SD1 and the second source/drain pattern SD2 may be positioned at a higher level than the upper surface of the second semiconductor pattern SP2.

In an implementation, the first source/drain pattern SD1 and the second source/drain pattern SD2 may not be formed at the same time. In an implementation, after a hard mask may be formed on the NMOSFET region NR and the first source/drain pattern SD1 may be formed in the PMOSFET region PR, a hard mask may be formed on the PMOSFET region PR, and the second source/drain pattern SD2 may be formed in the NMOSFET region NR. The first source/drain pattern SD1 may include a p-type impurity, and the second source/drain pattern SD2 may include an n-type impurity.

An upper portion of the second semiconductor pattern SP2 on the side surfaces of the first source/drain pattern SD1 may be defined as a first upper channel UC1, and an upper portion of the second semiconductor pattern SP2 on the side surfaces of the second source/drain pattern SD2 may be defined as a first upper channel UC1. In an implementation, the upper portion of the second semiconductor pattern SP2 on the side surfaces of the second source/drain pattern SD2 may be defined as a second upper channel UC2.

Figure 21:
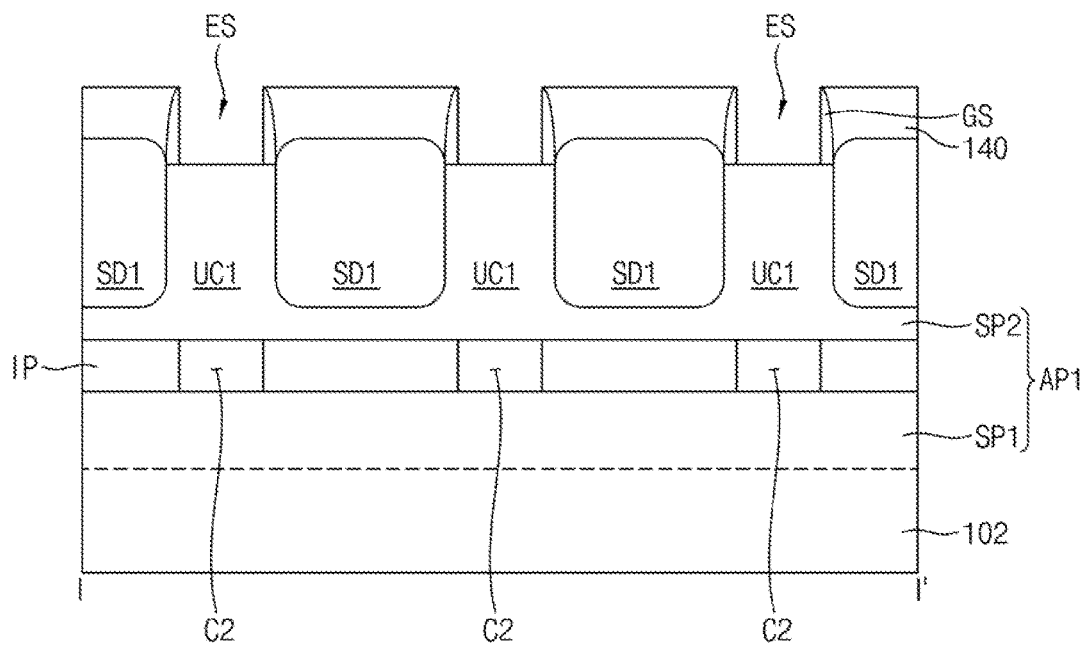
Figure 22:
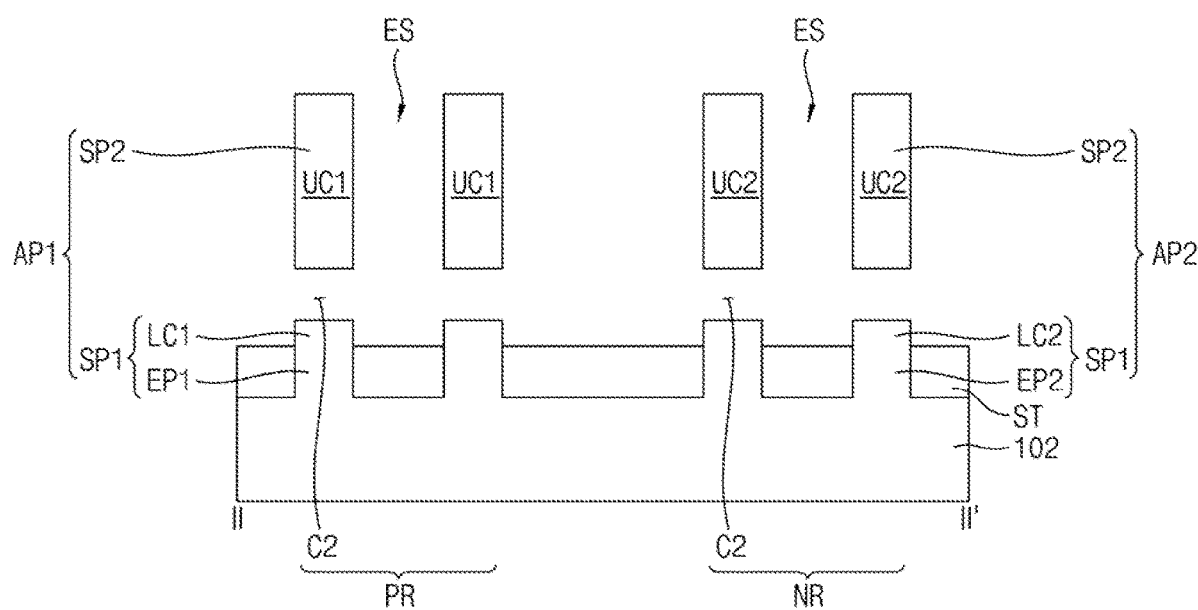
Figure 23:
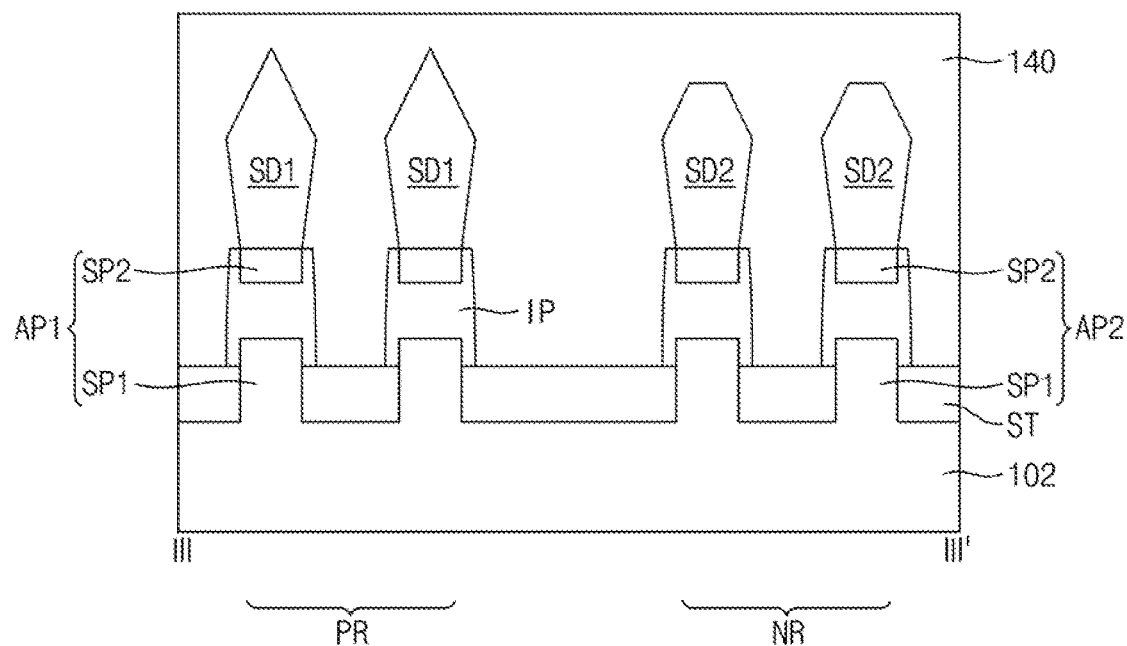

Referring to FIGS. 21 to 23, a first interlayer insulating layer 140 may be formed, and the preliminary gate pattern PP may be removed. The first interlayer insulating layer 140 may cover the insulating pattern IP, the first source/drain pattern SD1, and the second source/drain pattern SD2. Forming the first interlayer insulating layer 140 may include forming an insulating material so as to cover the second mask pattern MP2 and planarizing the insulating material. The second mask pattern MP2 may be removed through the planarization process, and a portion of the gate capping layer GP may be etched. The upper surface of the first interlayer insulating layer 140 may be coplanar with the upper surface of the gate capping layer GP.

The interlayer insulating layer may include silicon oxide, silicon nitride, silicon oxynitride, or a low-dielectric material, and may be composed of one or more layers. The low-dielectric material may include, e.g., undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, or a combination thereof.

The preliminary gate pattern PP exposed through the planarization process may be selectively removed. As a result of removal of the preliminary gate pattern PP, an empty space ES may be formed, and the space between the first semiconductor pattern SP1 and the second semiconductor pattern SP2 may be referred to as a second cavity C2.

Figure 24:
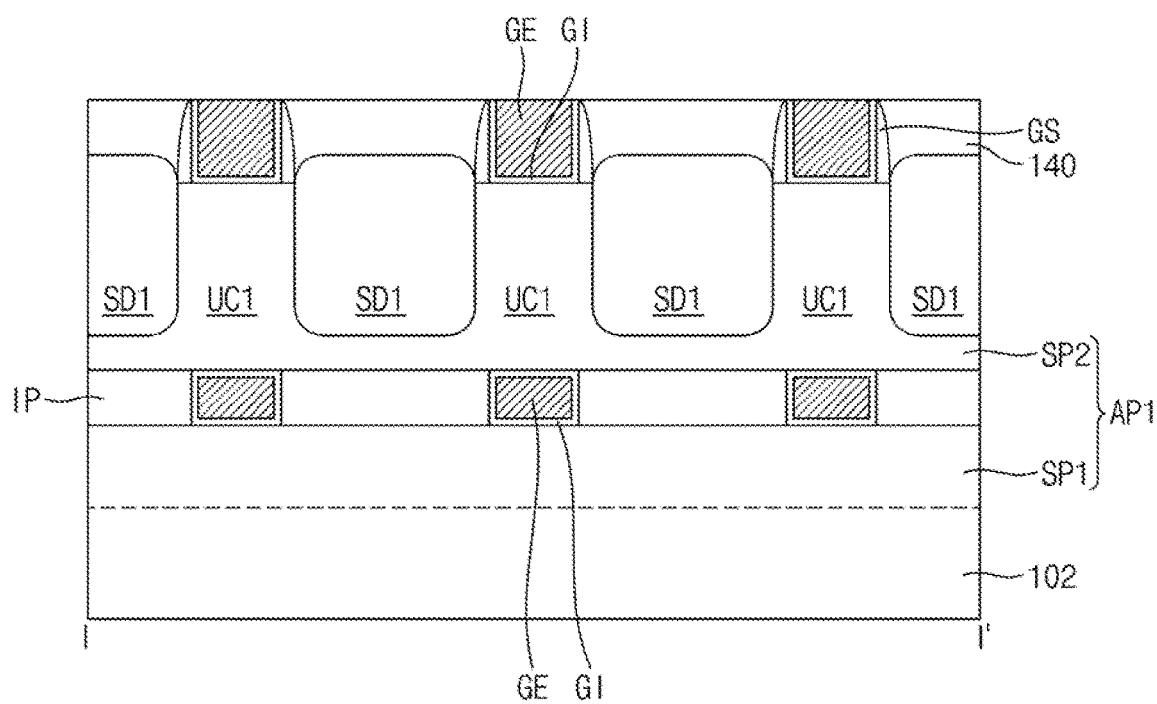
Figure 25:
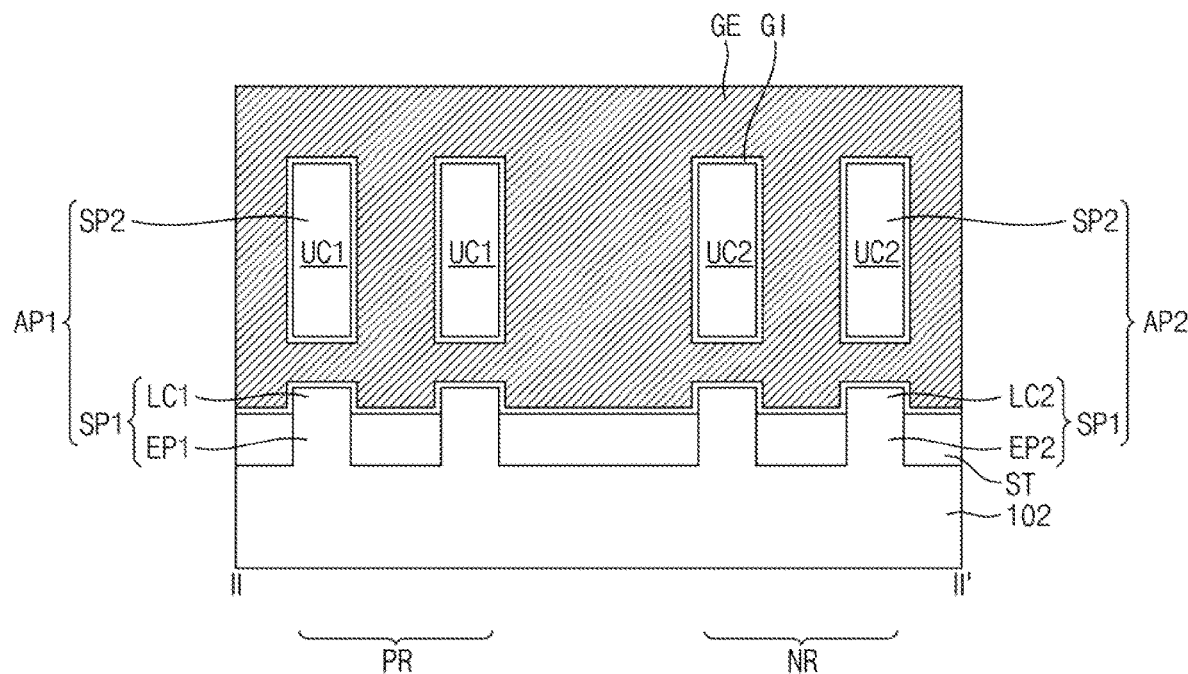

Referring to FIGS. 24 and 25, a gate insulating layer GI and a gate electrode GE may be formed. The gate insulating layer GI may be conformally formed in the empty space ES, and the gate electrode GE may be formed on the gate insulating layer GI, and may fill the empty space ES and the second cavity C2. In an implementation, the gate insulating layer GI may surround the first upper channel UC1 and the second upper channel UC2. In an implementation, the gate insulating layer GI may cover the device isolation layer ST, the first lower channel LC1, and the second lower channel LC2, and may be disposed between the gate electrode GE and the gate spacers GS. Here, the first lower channel LC1 and the second lower channel LC2 may respectively refer to a portion of the first semiconductor pattern SP1 and a portion of the second semiconductor pattern SP2 that are not covered by the device isolation layer ST. A portion of the first semiconductor pattern SP1 that is covered by the device isolation layer ST may be referred to as a first extension pattern EP1, and a portion of the second semiconductor pattern SP2 that is covered by the device isolation layer ST may be referred to as a second extension pattern EP2.

The gate insulating layer GI may include a material having a high dielectric constant (high-k). The material having a high dielectric constant may include, e.g., hafnium oxide, hafnium oxy-nitride, hafnium silicate, lanthanum oxide, zirconium oxide, zirconium silicate, tantalum oxide, barium strontium titanate (BST), barium titanate, strontium titanate, yttrium oxide, aluminum oxide, or a combination thereof. In an implementation, the gate insulating layer GI may include hafnium oxide ($HfO_2$).

The gate electrode GE may be formed by forming a gate electrode material such that the gate electrode material fills the empty space ES and planarizing the gate electrode material. The gate electrode GE may include aluminum, copper, titanium, tantalum, tungsten, molybdenum, tantalum nitride, nickel silicide, cobalt silicide, TiN, WN, TiAl, TiAlN, TaCN, TaC, TaSiN, a metal alloy, or a combination thereof.

Figure 26:
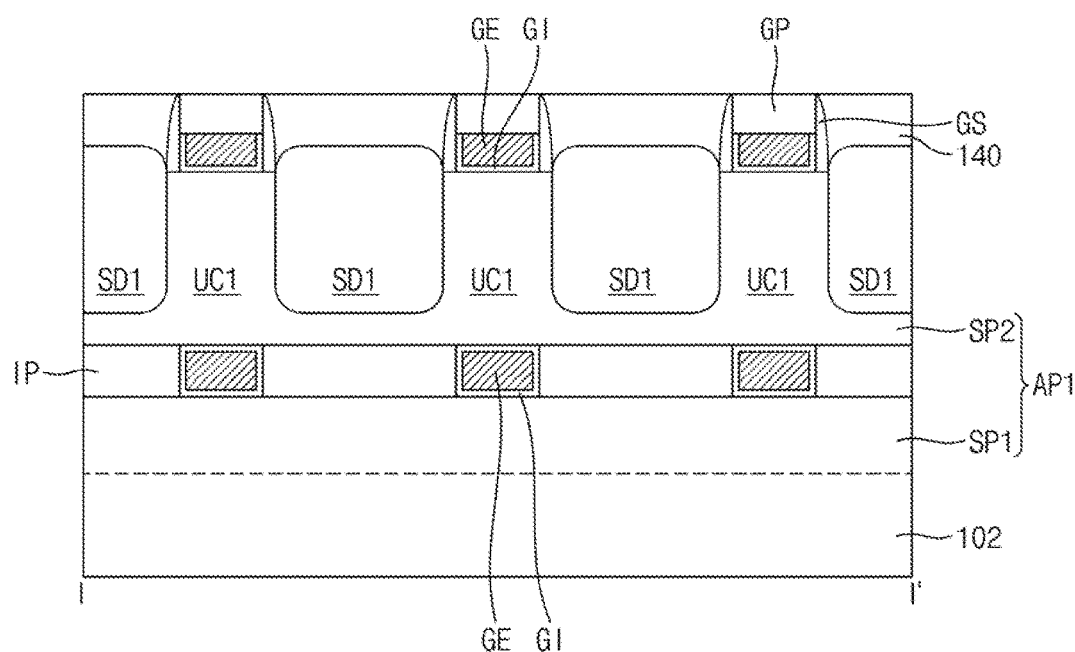
Figure 27:
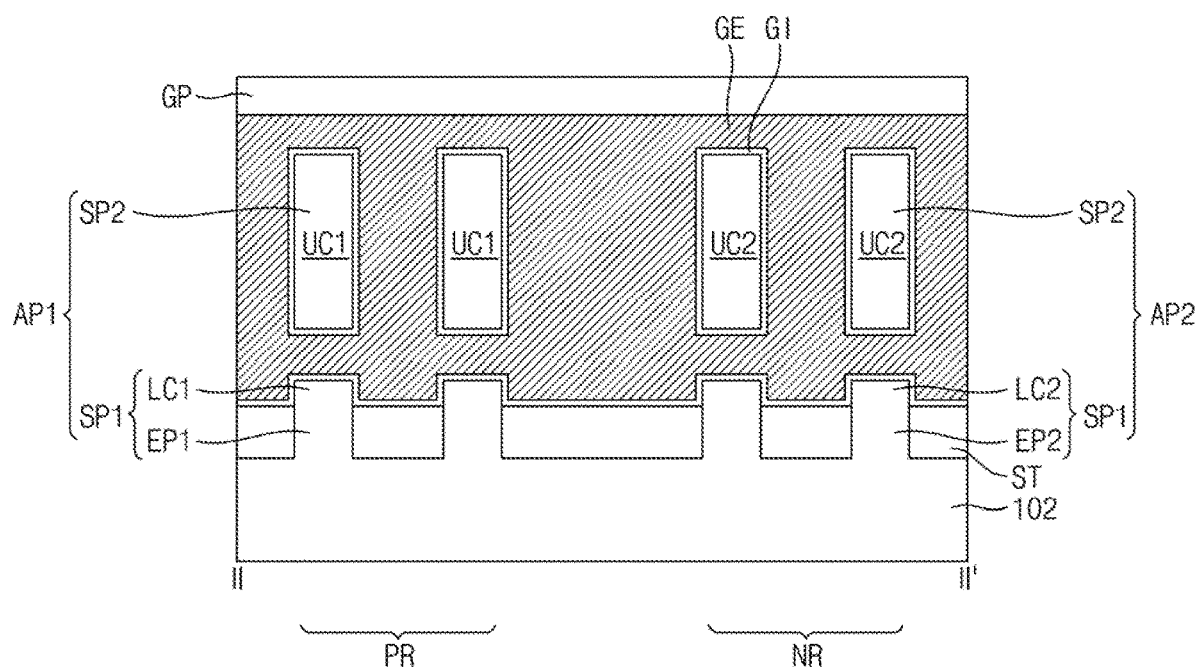

Referring to FIGS. 26 and 27, a gate capping layer GP may be formed. The gate capping layer GP may be formed by recessing the gate electrode GE and depositing a gate capping material thereon. The gate capping layer GP may be between the gate spacers GS, and may cover the gate electrode GE. The upper surface of the gate capping layer GP may be coplanar with the upper surface of the first interlayer insulating layer 140. In an implementation, the gate capping layer GP may include silicon nitride.

Referring back to FIGS. 1 to 4, a second interlayer insulating layer 150 and contacts 160 may be formed. The second interlayer insulating layer 150 may cover the first interlayer insulating layer 140 and the gate capping layer GP. The second interlayer insulating layer 150 may include silicon oxide.

Forming the contacts 160 may include etching the first interlayer insulating layer 140 and the second interlayer insulating layer 150 such that the first source/drain pattern SD1 and the second source/drain pattern SD2 are exposed and forming a barrier layer 162 and a conductive layer 164 so as to be connected to the first source/drain pattern SD1 and the second source/drain pattern SD2. The barrier layer 162 may include metal nitride such as titanium nitride, tantalum nitride, or tungsten nitride. The conductive layer 164 may include a metal such as aluminum, copper, tungsten, molybdenum, or cobalt.

Figure 28:
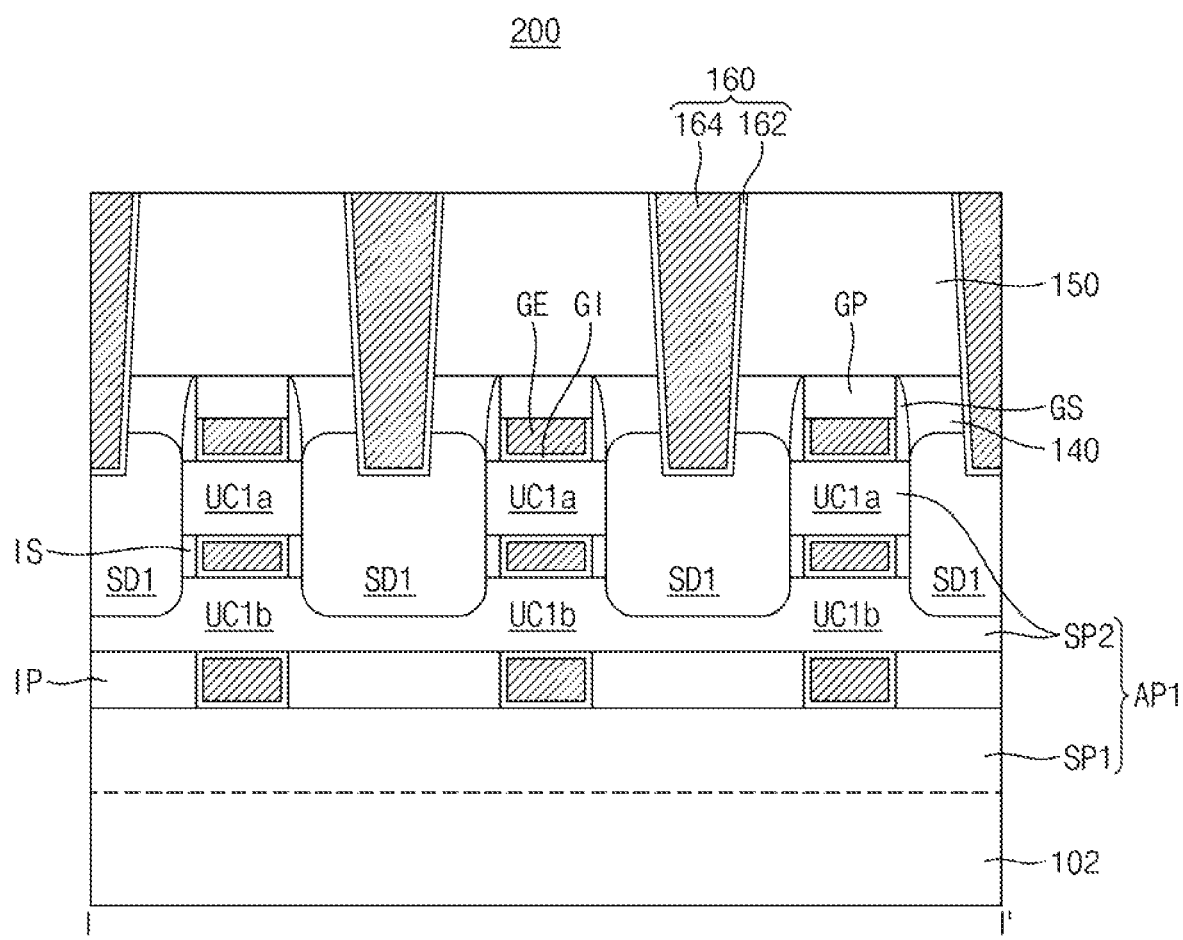
FIG. 28 is a cross-sectional view taken of a semiconductor device according to an example embodiment.
Figure 29:
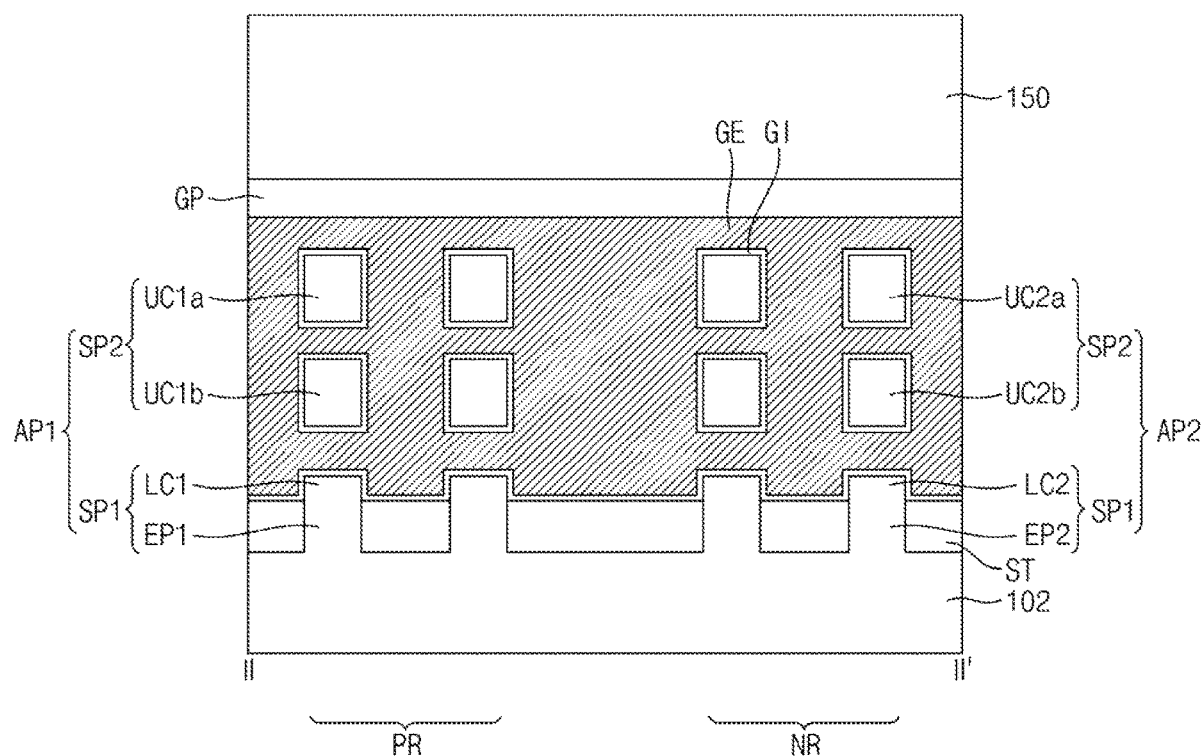
FIG. 29 is a cross-sectional view of a semiconductor device according to an example embodiment.

FIG. 28 is a cross-sectional view of a semiconductor device according to an example embodiment. FIG. 29 is a cross-sectional view of a semiconductor device according to an example embodiment.

Referring to FIGS. 28 and 29, a semiconductor device 200 may include a first active pattern AP1 in a PMOSFET region PR and a second active pattern AP2 in an NMOSFET region NR. The first active pattern AP1 may include a first semiconductor pattern SP1 and a second semiconductor pattern SP2, and the second semiconductor pattern SP2 may include a plurality of first upper channels UC1a and UC1b, which are spaced apart from each other in the vertical direction D3, in the PMOSFET region PR. The second active pattern AP2 may include a first semiconductor pattern SP1 and a second semiconductor pattern SP2, and the second semiconductor pattern SP2 may include a plurality of second upper channels UC2a and UC2b, which are spaced apart from each other in the vertical direction, in the NMOSFET region NR. The semiconductor device 200 may include inner spacers IS between the plurality of first upper channels UC1a and UC1b. The inner spacers IS may be in contact with the first source/drain pattern SD1, and the outer surfaces of the inner spacers IS may be coplanar with the outer surfaces of the plurality of first upper channels UC1a and UC1b. The inner spacers IS may electrically insulate the gate electrode GE from the first source/drain pattern SD1. In an implementation, the inner spacers IS may also be between the plurality of second upper channels UC2a and UC2b. The inner spacers IS may include silicon oxide, silicon nitride, a low-dielectric material, or a combination thereof.

Figure 30:
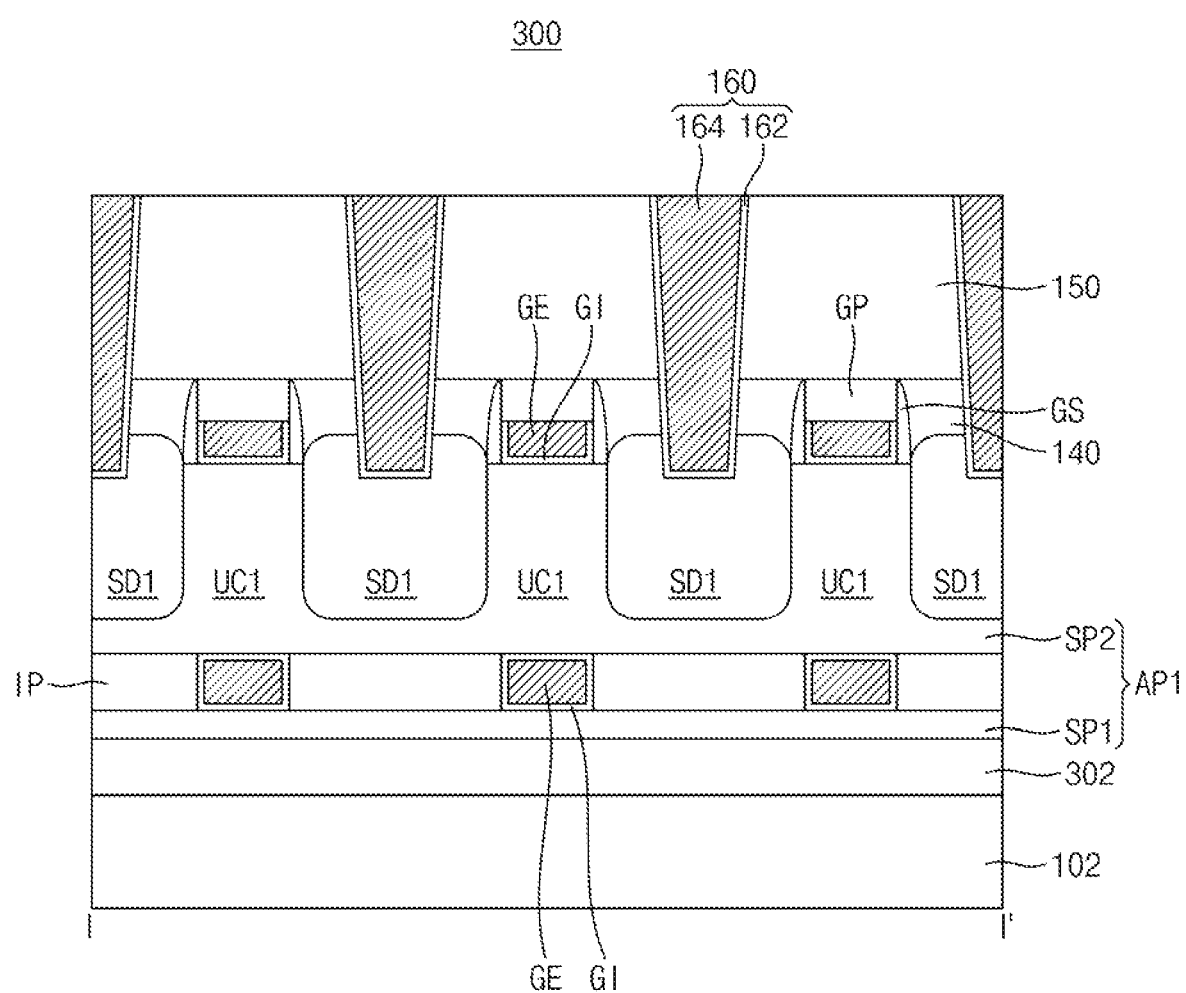
FIG. 30 is a cross-sectional view of a semiconductor device according to an example embodiment.
Figure 31:
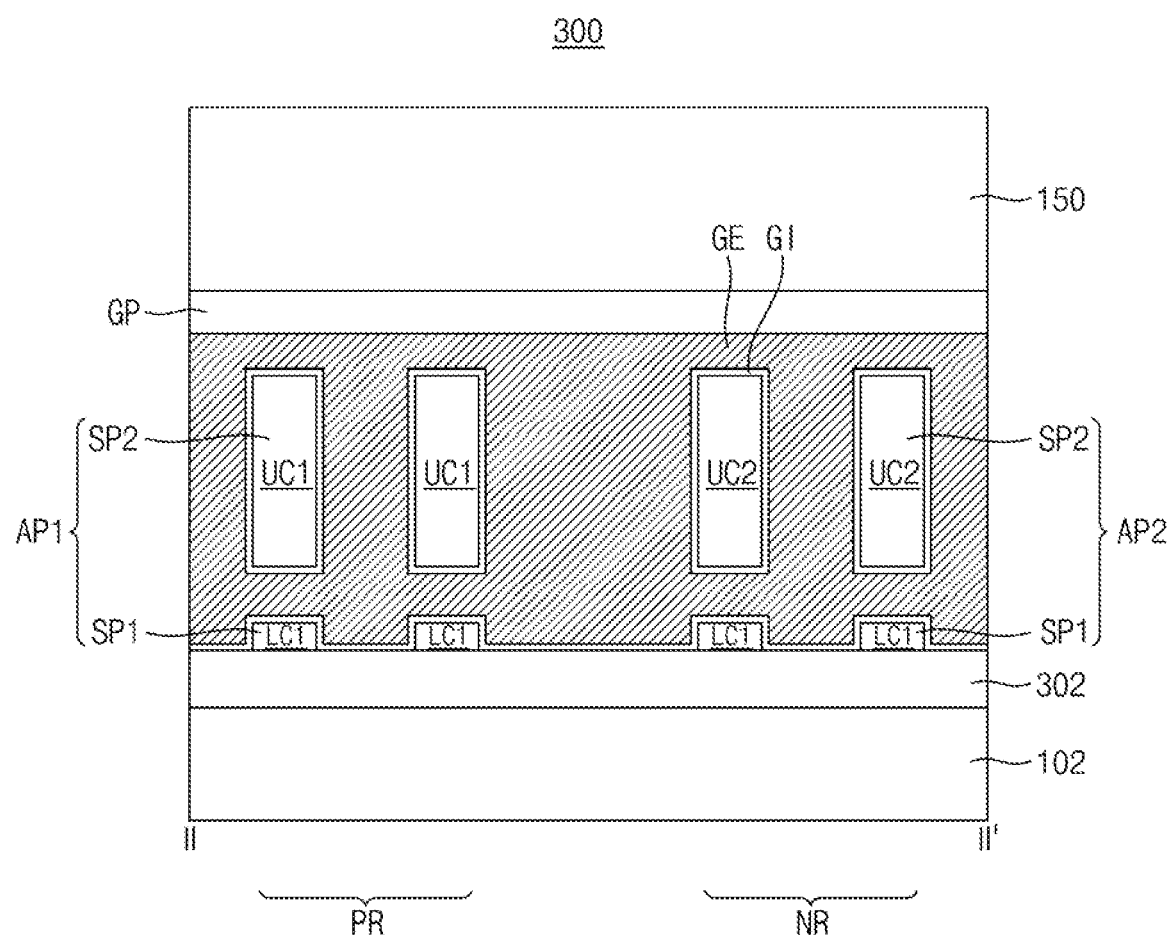
FIG. 31 is a cross-sectional view of a semiconductor device according to an example embodiment.
Figure 32:
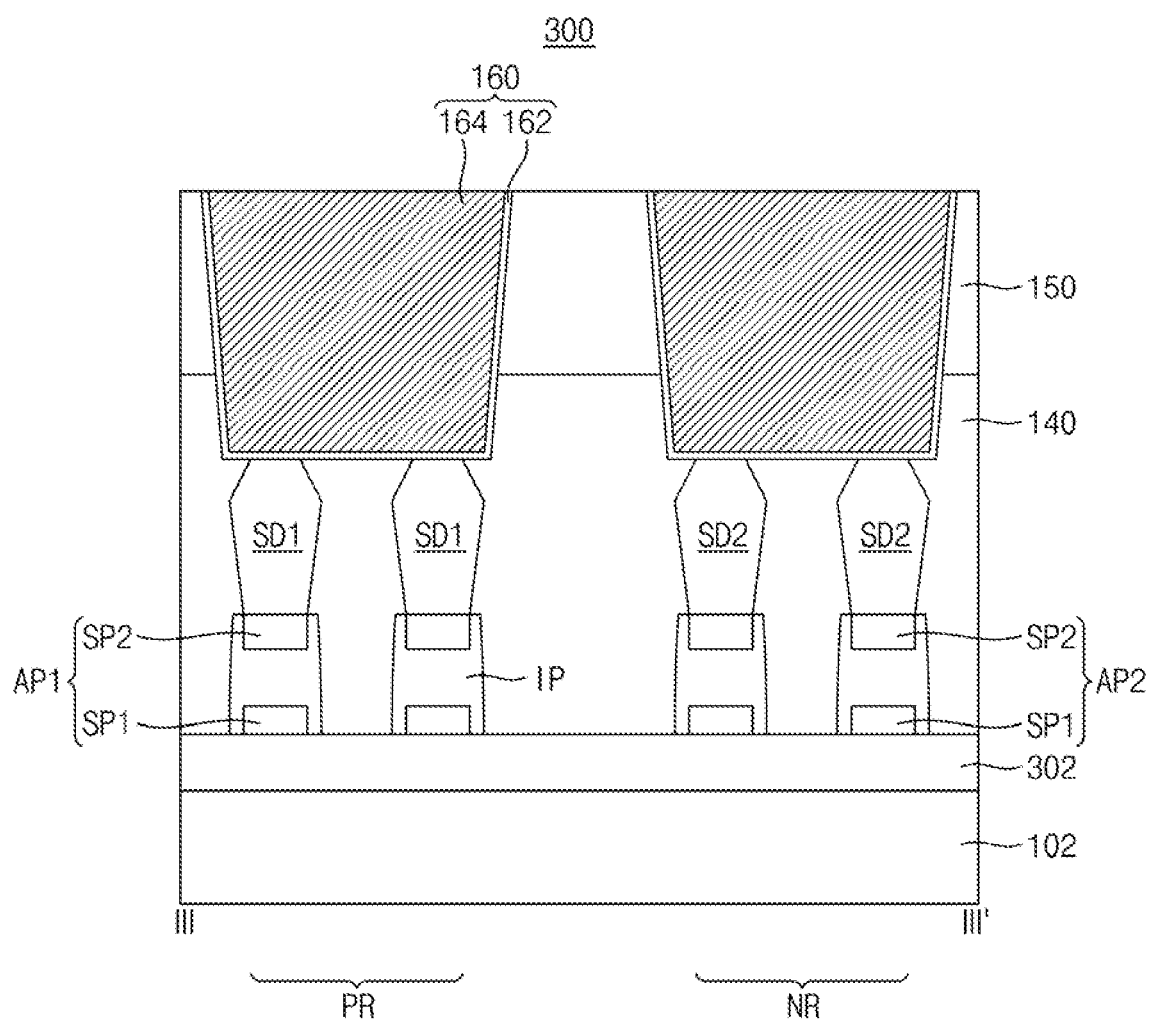
FIG. 32 is a cross-sectional view of a semiconductor device according to an example embodiment.

FIG. 30 is a cross-sectional view of a semiconductor device according to an example embodiment. FIG. 31 is a cross-sectional view of a semiconductor device according to an example embodiment. FIG. 32 is a cross-sectional view of a semiconductor device according to an example embodiment.

Referring to FIGS. 30 to 32, a semiconductor device 300 may include a buried insulating layer 302 between a substrate 102 and a first semiconductor pattern SP1. The first semiconductor pattern SP1 may be on the buried insulating layer 302. The first semiconductor pattern SP1 in a PMOSFET region PR may be referred to as a first lower channel LC1, and the first semiconductor pattern SP1 in an NMOSFET region NR may be referred to as a second lower channel LC2. In an implementation, the substrate 102, the buried insulating layer 302, the first lower channel LC1, and the second lower channel LC2 may be formed by patterning an SOI substrate 102.

Figure 33:
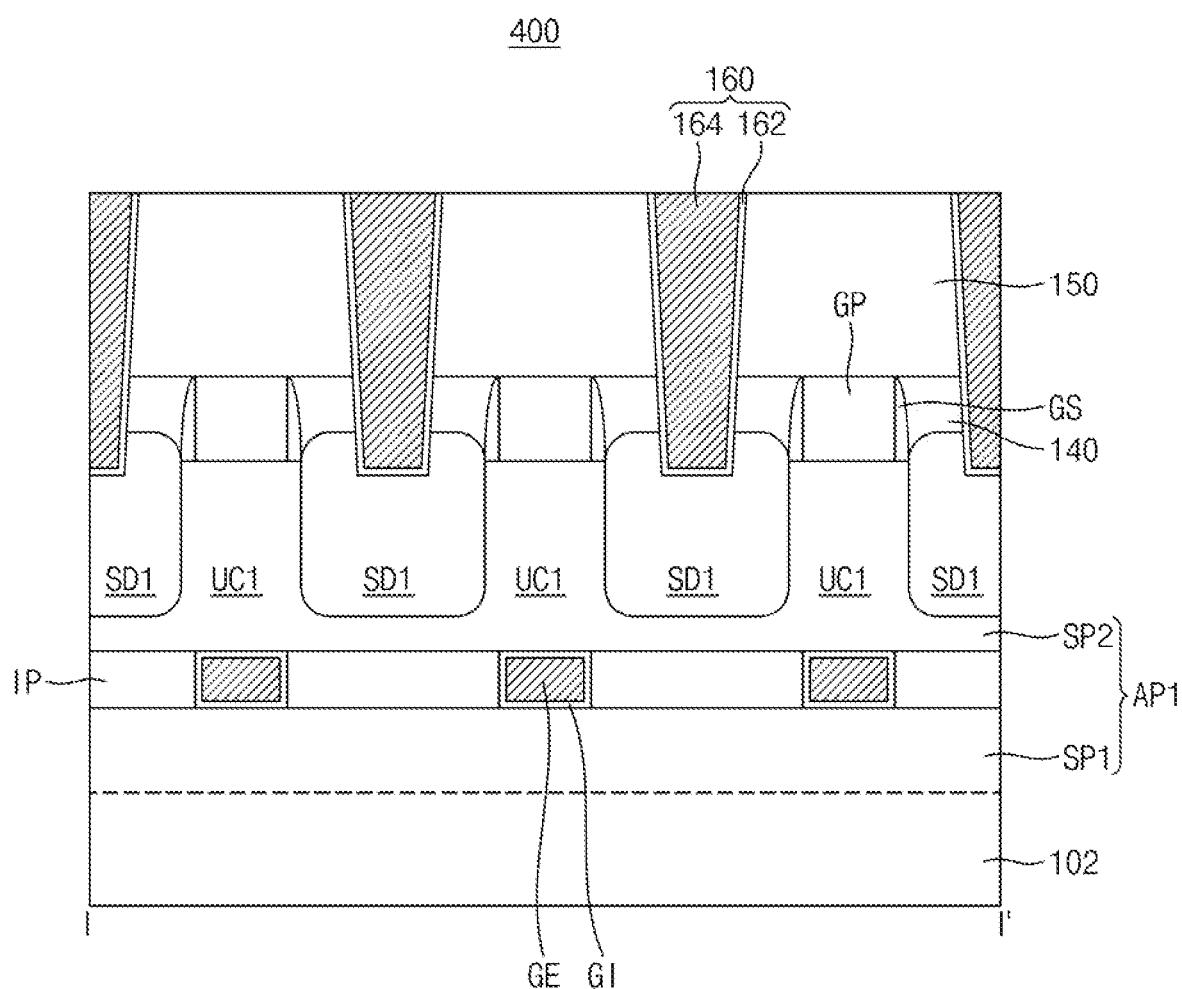
FIG. 33 is a cross-sectional view of a semiconductor device according to an example embodiment.
Figure 34:
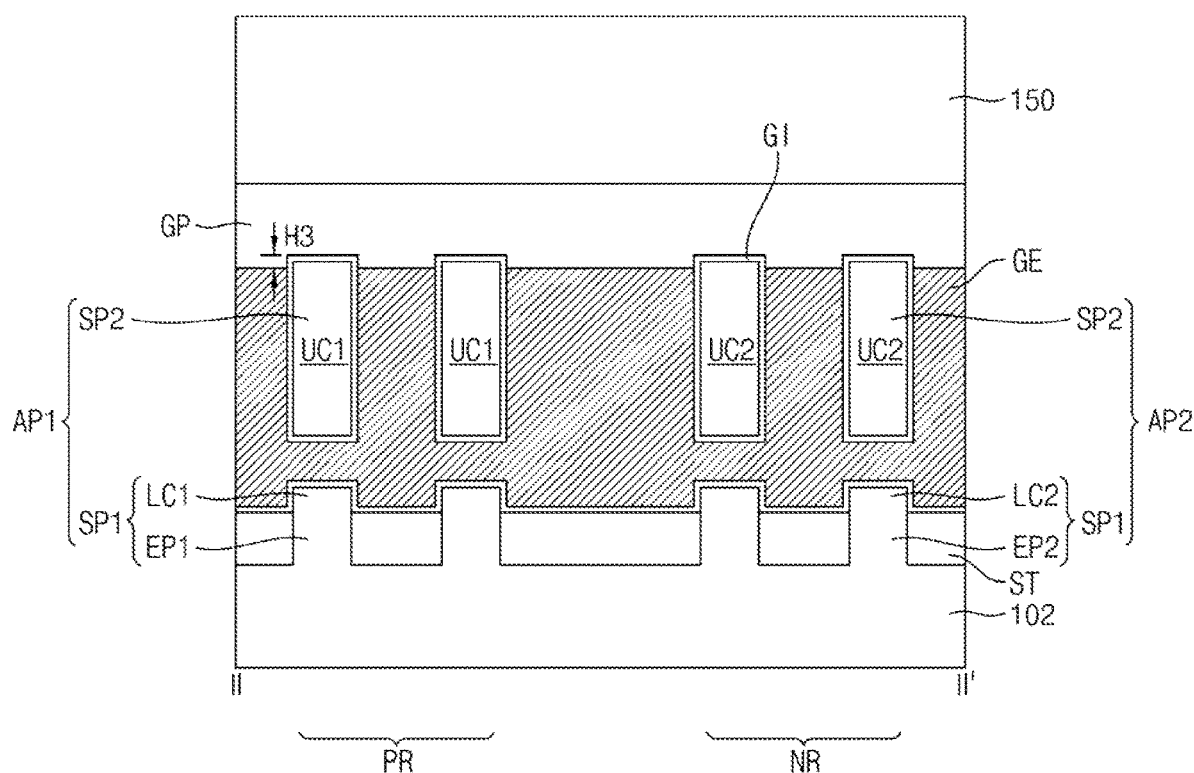
FIG. 34 is a cross-sectional view of a semiconductor device according to an example embodiment.

FIG. 33 is a vertical cross-sectional of a semiconductor device according to an example embodiment. FIG. 34 is a vertical cross-sectional of a semiconductor device according to an example embodiment.

Referring to FIGS. 33 and 34, a semiconductor device 400 may include a gate capping layer GP covering a gate electrode GE. In an implementation, a lower (e.g., substrate 102-facing) surface of the gate capping layer GP may be positioned at a lower level than the upper surface of a gate insulating layer GI covering a first upper channel UC1 or a second upper channel UC2 (e.g., in the vertical direction). The upper surface of the gate electrode GE may be positioned at a lower level than the upper surface of the gate insulating layer GI covering the first upper channel UC1 or the second upper channel UC2. The height H3 (in the vertical direction D3) from the upper surface of the gate electrode GE to the upper surface of the gate insulating layer GI may be, e.g., 10 nm or less.

Figure 35:
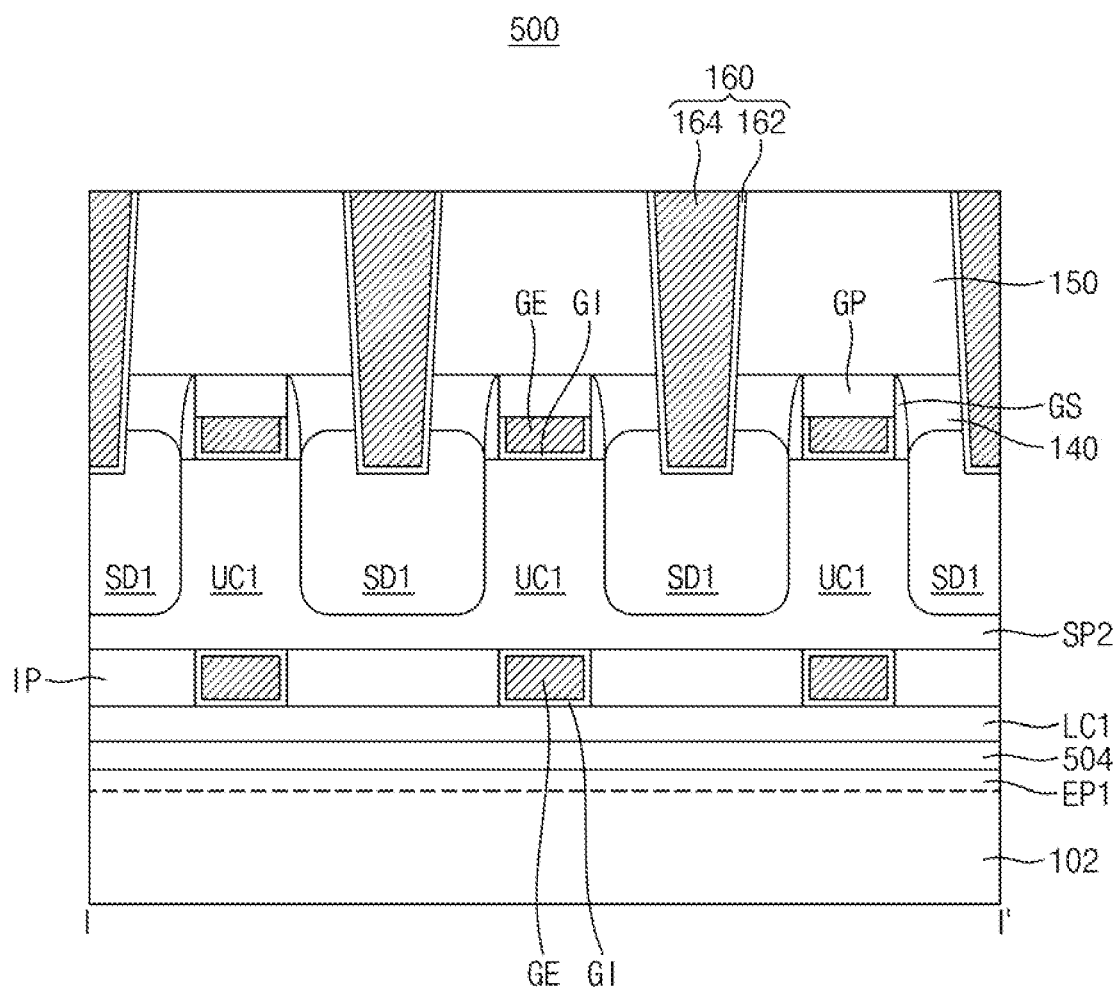
FIG. 35 is a cross-sectional view of a semiconductor device according to an example embodiment.
Figure 36:
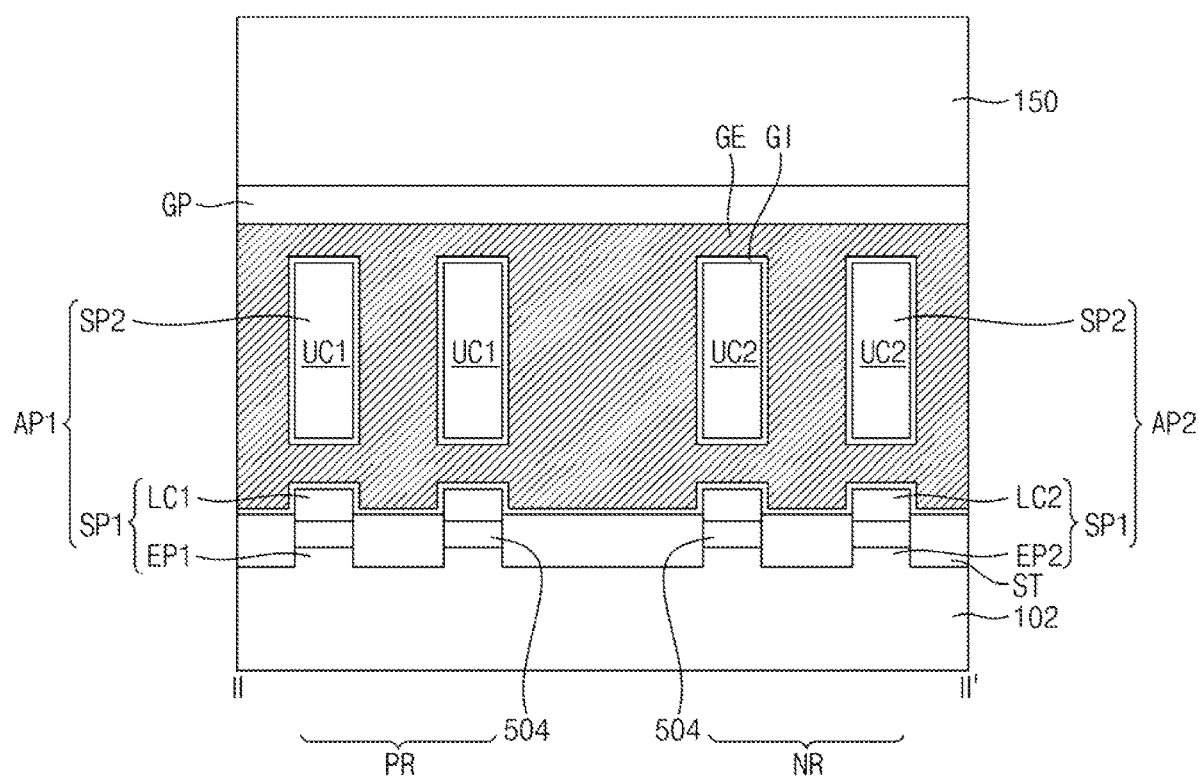
FIG. 36 is a cross-sectional view of a semiconductor device according to an example embodiment.

FIG. 35 is a cross-sectional view of a semiconductor device according to an example embodiment. FIG. 36 is a cross-sectional view of a semiconductor device according to an example embodiment.

Referring to FIGS. 35 and 36, a semiconductor device 500 may include a semiconductor oxide layer 504 on a substrate 102. In an implementation, a first lower channel LC1 may be spaced apart from a first extension pattern EP1 in the vertical direction D3, and a second lower channel LC2 may be spaced apart from a second extension pattern EP2 in the vertical direction D3. In an implementation, a semiconductor oxide layer 504 may be between the first lower channel LC1 and the first extension pattern EP1 and between the second lower channel LC2 and the second extension pattern EP2. The side surface of the semiconductor oxide layer 504 may be in contact with a device isolation layer ST. The upper surface (e.g., a plane of the upper surface) of the device isolation layer ST may be positioned between the upper surfaces (e.g., planes of the upper surfaces) of the first and second lower channels LC1 and LC2 and the lower surfaces thereof. The semiconductor oxide layer 504 may electrically insulate the first lower channel LC1 and the second lower channel LC2 from the first extension pattern EP1 and the second extension pattern EP2. In an implementation, parasitic capacitance caused by the first lower channel LC1 and the second lower channel LC2 during operation of the device may be prevented or reduced.

FIGS. 37 to 42 are cross-sectional views of stages in a method of manufacturing a semiconductor device shown in FIGS. 35 and 36.

Figure 37:
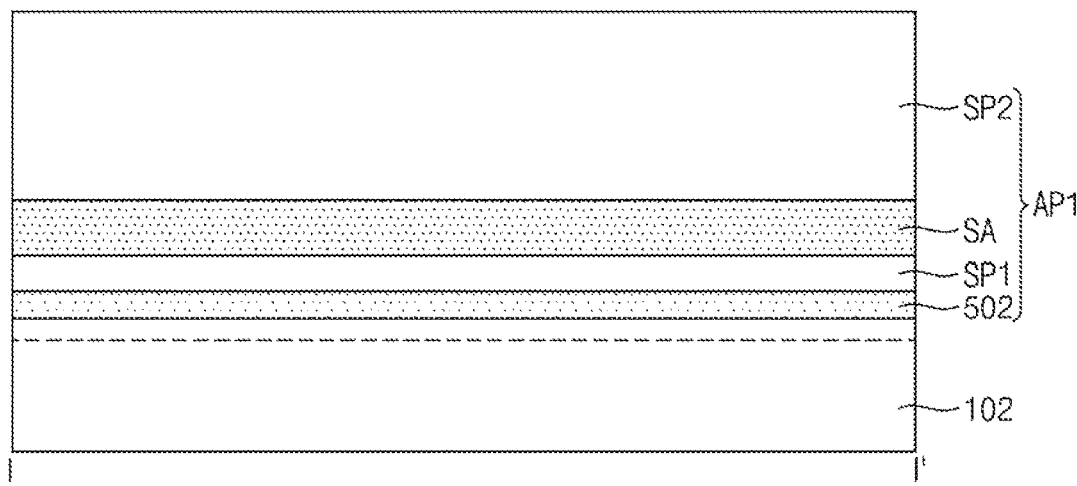
FIGS. 37 to 42 are cross-sectional views of stages in a method of manufacturing the semiconductor device of FIGS. 35 and 36.
Figure 38:
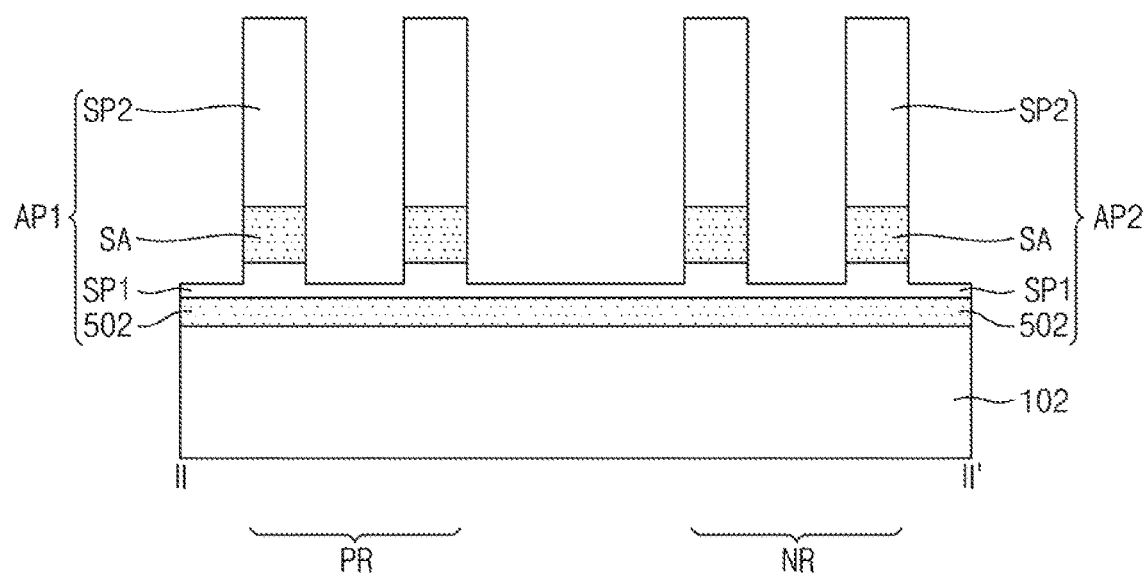

Referring to FIGS. 37 and 38, a semiconductor layer 502, a first semiconductor pattern SP1, a sacrificial pattern SA, and a second semiconductor pattern SP2 may be formed on a substrate 102. The semiconductor layer 502, the first semiconductor pattern SP1, the sacrificial pattern SA, and the second semiconductor pattern SP2 may be formed by performing a selective epitaxial growth process using the substrate 102 as a seed. In an implementation, the semiconductor layer 502 and the sacrificial pattern SA may include SiGe.

Figure 7:
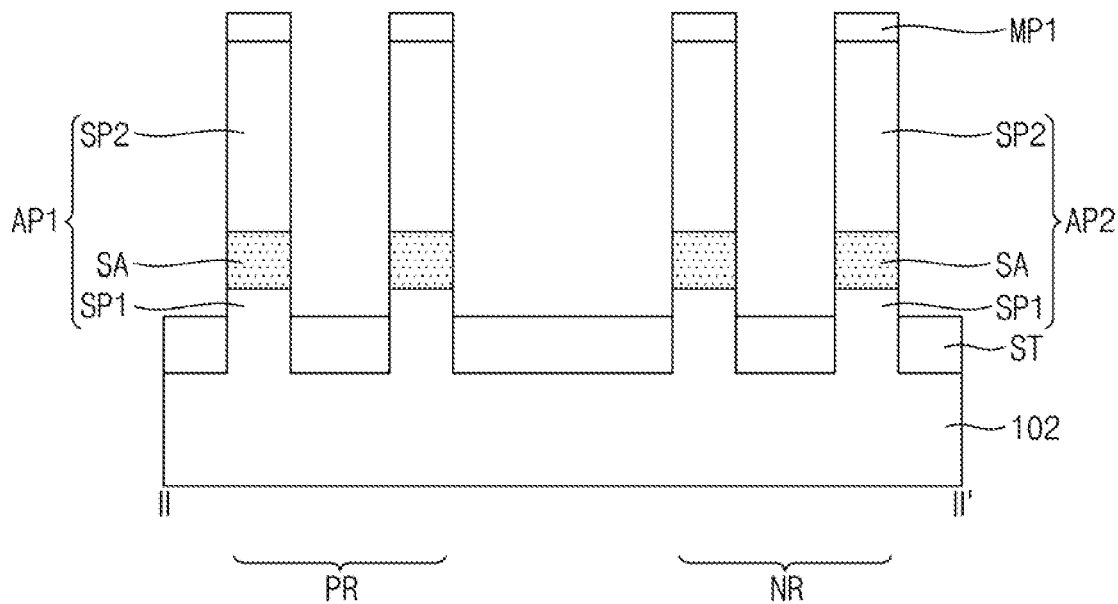
Figure 8:
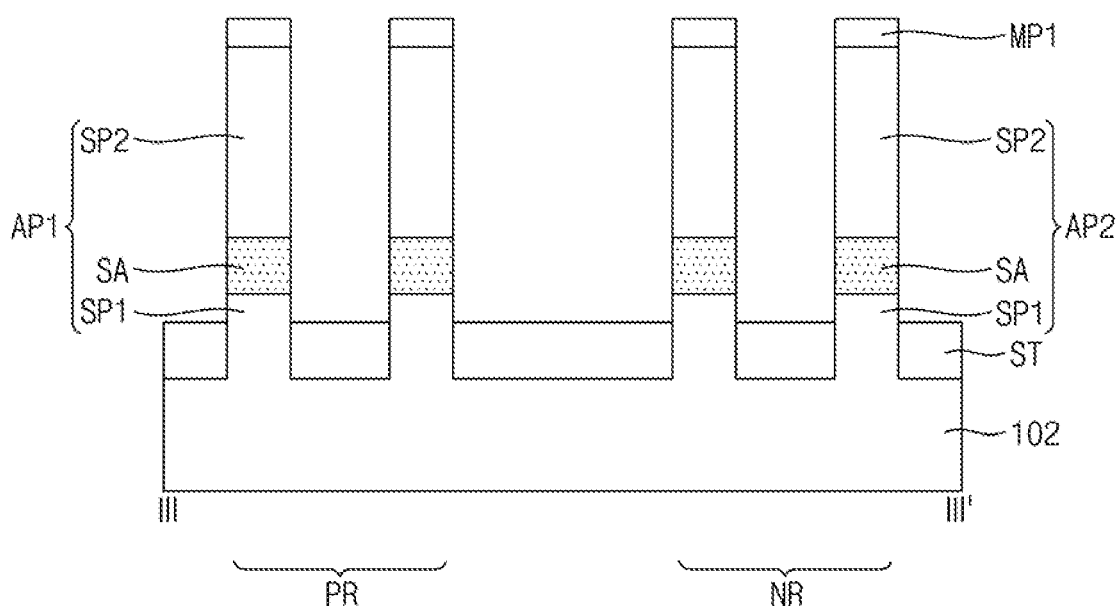

Referring to FIG. 7, the first semiconductor pattern SP1, the sacrificial pattern SA, and the second semiconductor pattern SP2 may be patterned. The semiconductor layer 502 may not be patterned, and may not be exposed.

Figure 39:
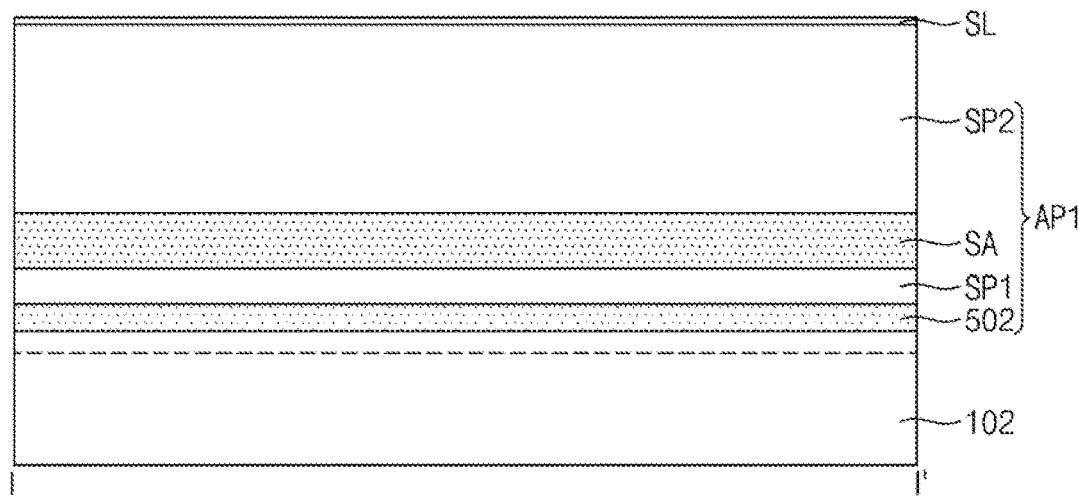
Figure 40:
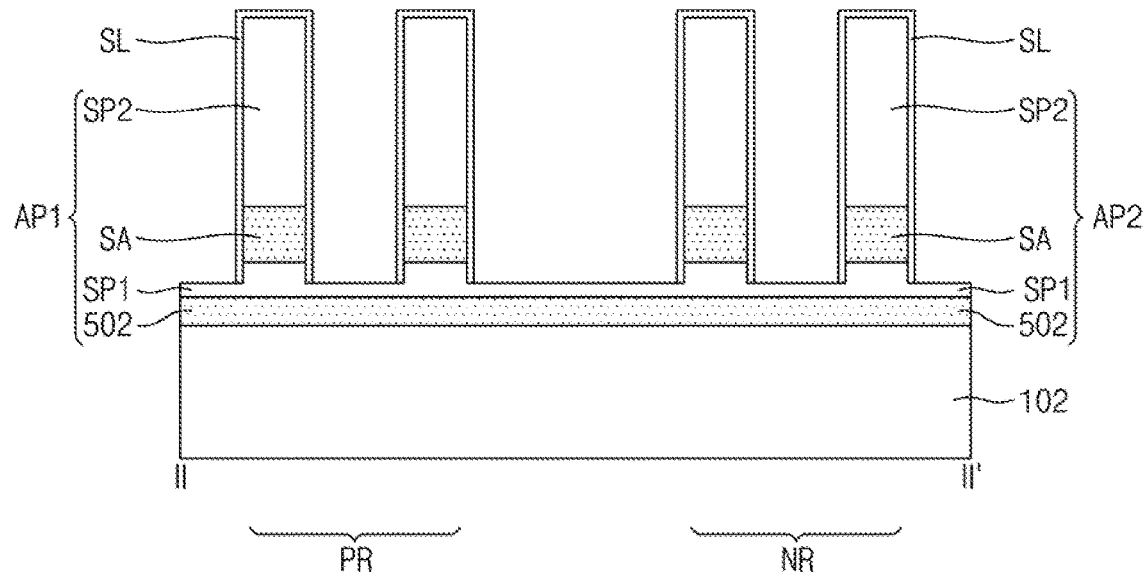

Referring to FIGS. 39 and 40, a spacer layer SL may be formed on the results of the processing shown in FIGS. 37 and 38. The spacer layer SL may cover the sacrificial pattern SA and the second semiconductor pattern SP2. After the spacer layer SL is formed, the upper surface of the first semiconductor pattern SP1 may be partially exposed through an anisotropic etching process. In an implementation, the spacer layer SL may include silicon nitride.

Figure 41:
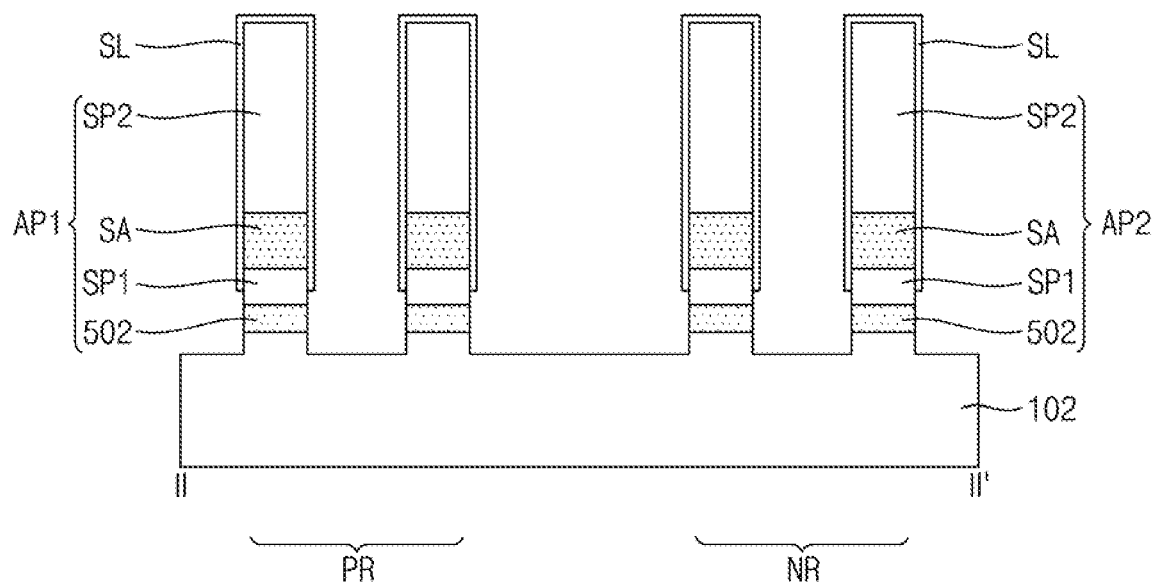

Referring to FIG. 41, an anisotropic etching process may be performed. The semiconductor layer 502 may be patterned through the etching process. The semiconductor layer 502 may be patterned in the same manner as the first semiconductor pattern SP1, the sacrificial pattern SA, and the second semiconductor pattern SP2. The spacer layer SL may help prevent the sacrificial pattern SA and the second semiconductor pattern SP2 from being removed in the etching process.

Figure 42:
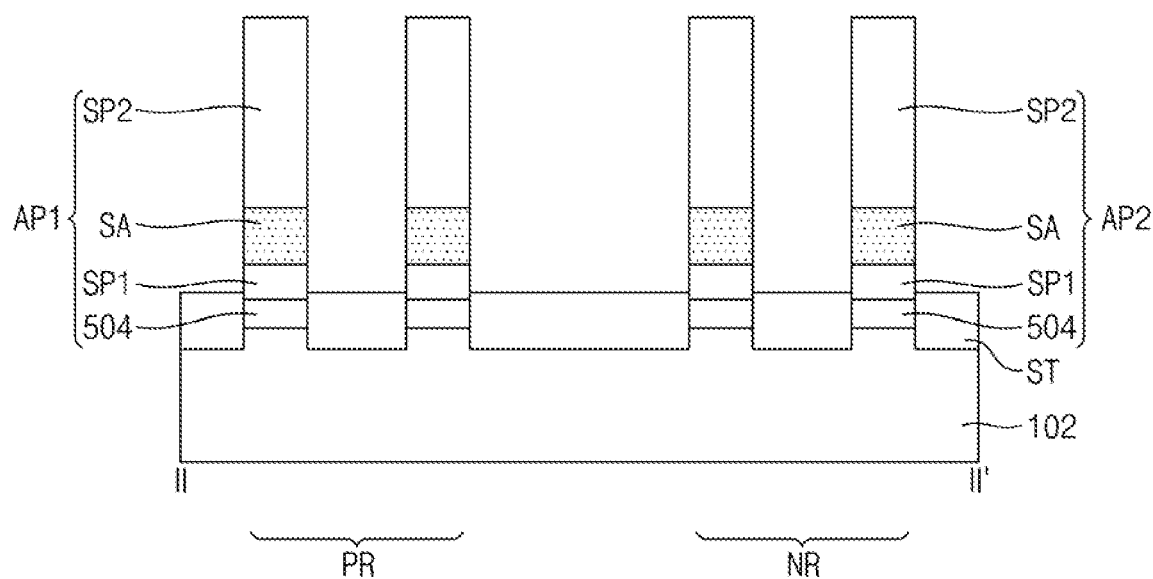

Referring to FIG. 42, a semiconductor oxide layer 504 may be formed. Forming the semiconductor oxide layer 504 may include a process of oxidizing the semiconductor layer 502. In an implementation, the semiconductor oxide layer 504 may include silicon germanium oxide (SiGeO).

Thereafter, the spacer layer SL may be removed, and the device isolation layer ST may be formed. The device isolation layer ST may cover the upper surface of the substrate 102 and the semiconductor oxide layer 504. The upper surface of the device isolation layer ST may be positioned at a lower level than the upper surface of the first semiconductor pattern SP1, and may be positioned at a higher level than the upper surface of the semiconductor oxide layer 504. Thereafter, the processes described with reference to FIGS. 9 to 27 may be performed in sequence.

Figure 43:
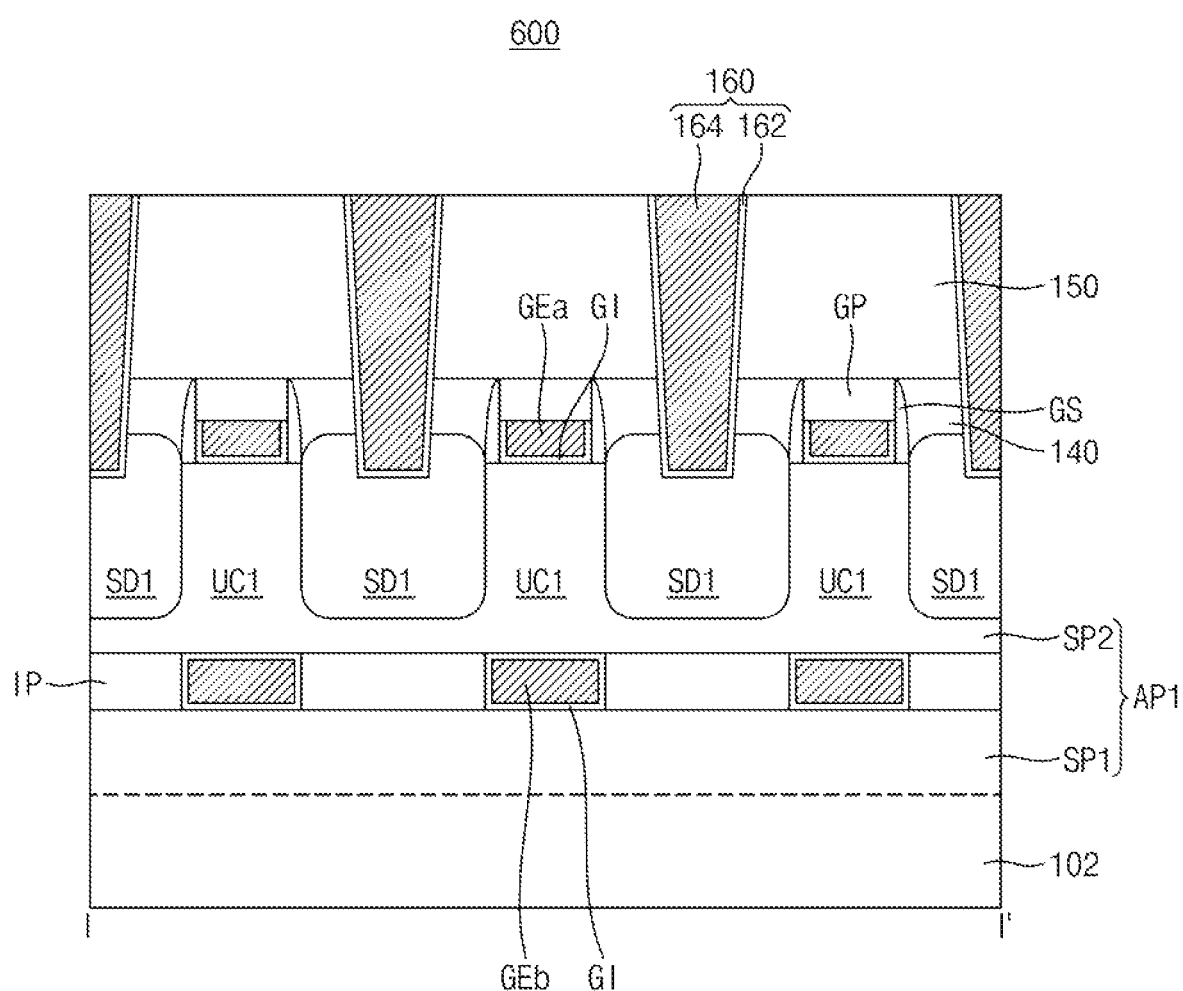
FIGS. 43 and 44 are cross-sectional views of a semiconductor device according to example embodiments.
Figure 44:
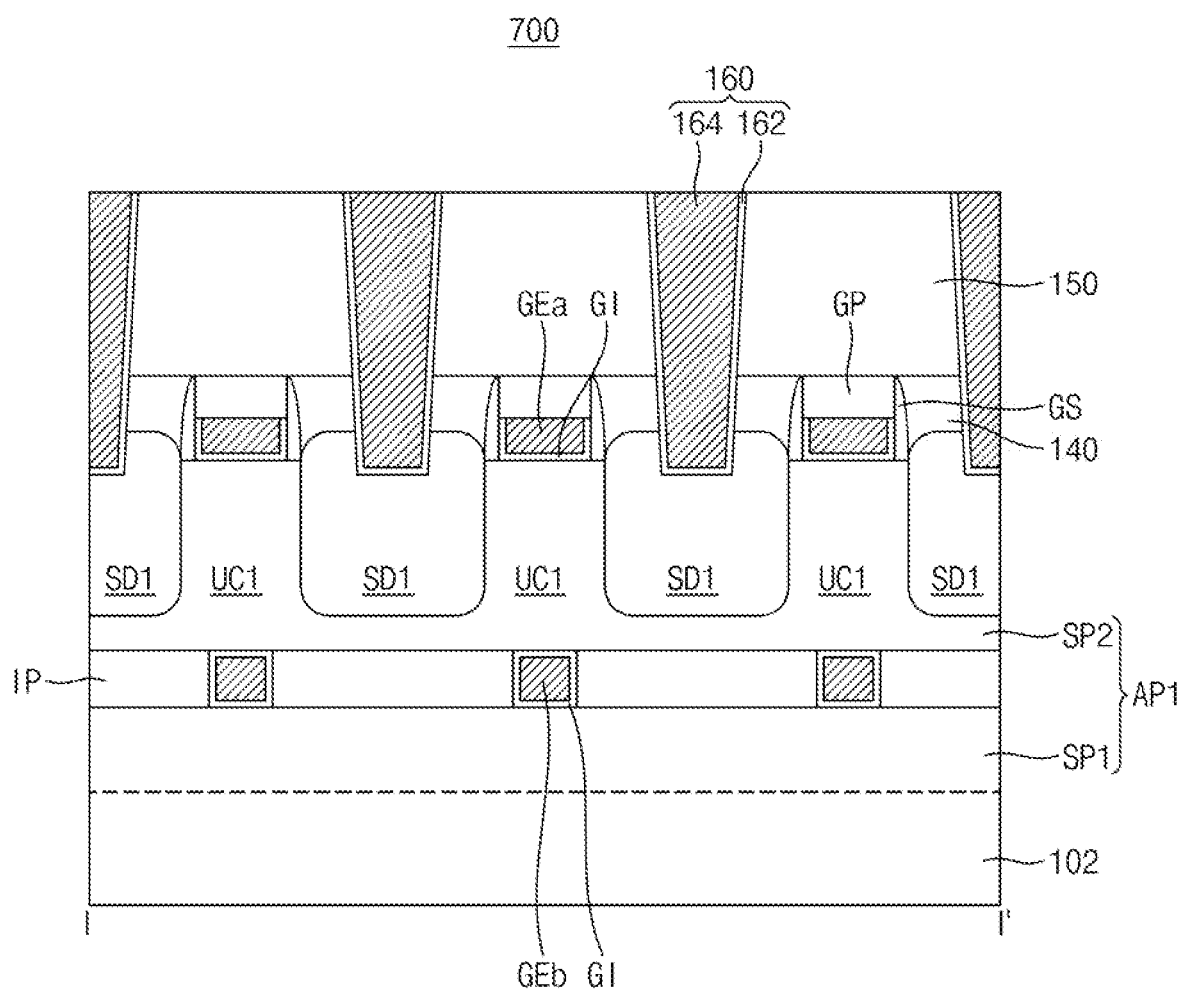

FIGS. 43 and 44 are cross-sectional views of a semiconductor device according to example embodiments.

Referring to FIG. 43, a semiconductor device 600 may include an upper intersection GEa between a first upper channel UC1 and a gate capping layer GP and a lower intersection GEb between the first upper channel UC1 and a first semiconductor pattern SP1. In an implementation, the width of the lower intersection GEb in the first horizontal direction D1 may be greater than the width of the upper intersection GEa in the first horizontal direction D1.

Referring to FIG. 44, a semiconductor device 700 may include an upper intersection GEa between a first upper channel UC1 and a gate capping layer GP and a lower intersection GEb between the first upper channel UC1 and a first semiconductor pattern SP1. In an implementation, the width of the lower intersection GEb in the first horizontal direction D1 may be less than the width of the upper intersection GEa in the first horizontal direction D1.

Figure 45:
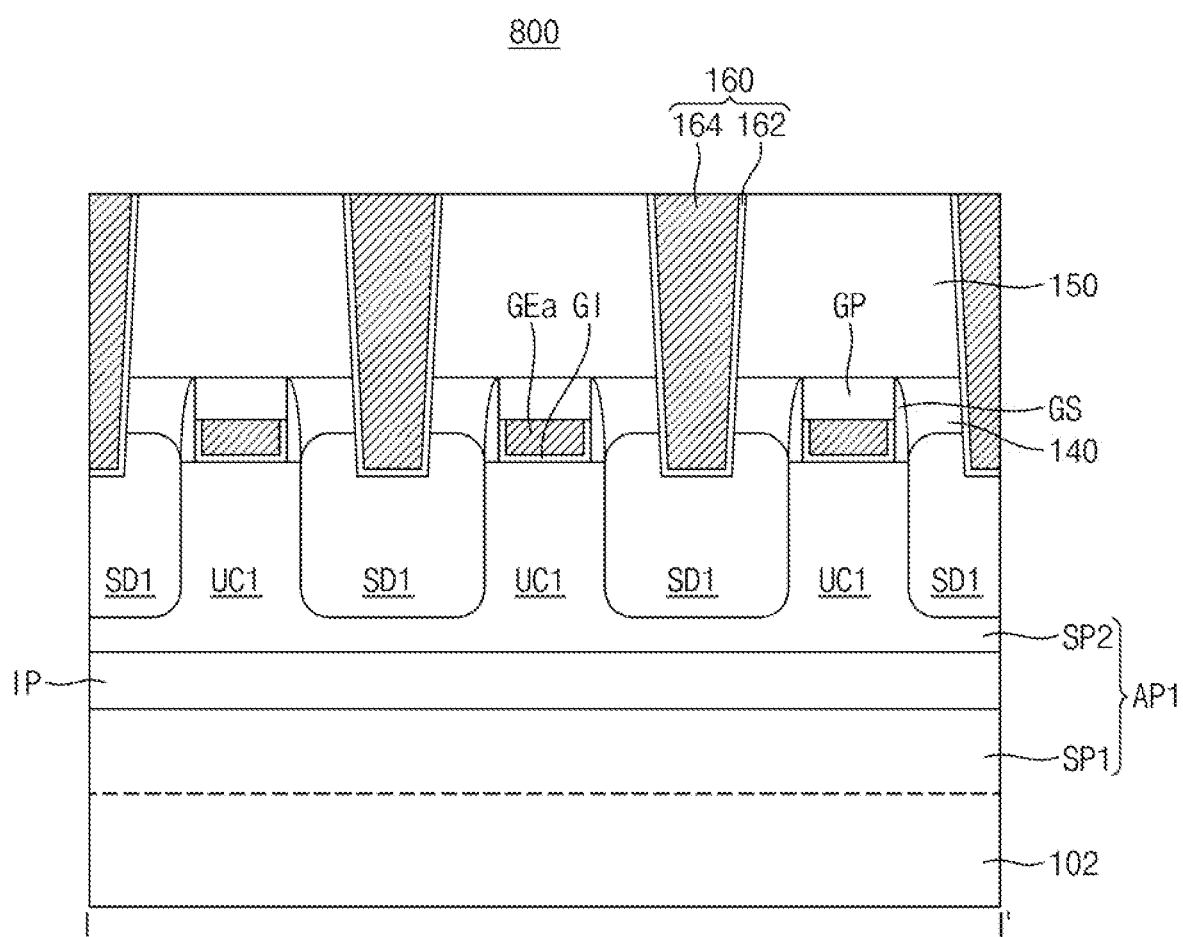
FIGS. 45 and 46 vertical cross-sectional views of a semiconductor device according to an example embodiment.
Figure 46:
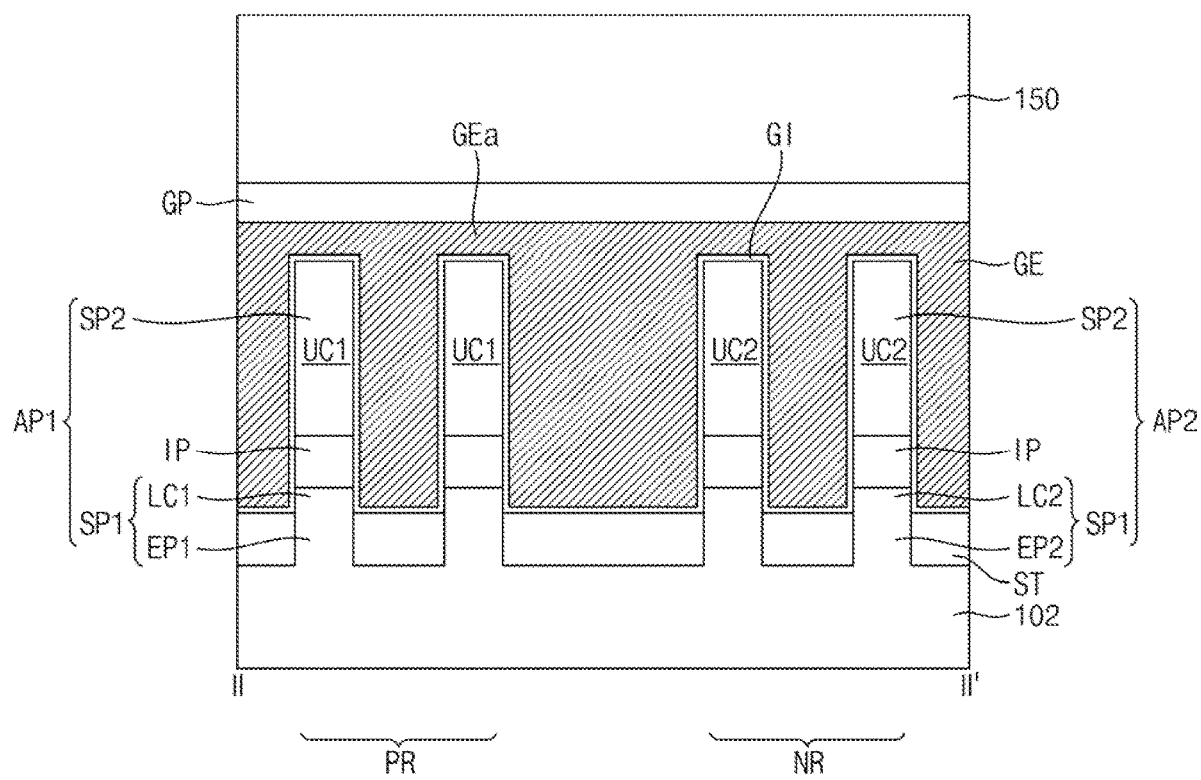

FIGS. 45 and 46 are cross-sectional views of a semiconductor device according to an example embodiment.

Referring to FIGS. 45 and 46, a semiconductor device 800 may include an insulating pattern IP between a first semiconductor pattern SP1 and a second semiconductor pattern SP2. In an implementation, the insulating pattern IP may completely fill the space between the first semiconductor pattern SP1 and the second semiconductor pattern SP2. In an implementation, a portion of a gate electrode GE may not be between the first semiconductor pattern SP1 and the second semiconductor pattern SP2. A gate insulating layer GI may cover the side surface of the insulating pattern IP.

By way of summation and review, the length of a channel of a transistor may be reduced, and the distance between source/drain regions may also be reduced. Capacitance between a channel and a substrate may be an issue.

One or more embodiments may provide a semiconductor device including an undoped substrate, a first semiconductor pattern, and an upper channel.

As is apparent from the above description, according to the example embodiments of the disclosure, a semiconductor device may include an undoped substrate, a first semiconductor pattern, and an upper channel, thereby reducing capacitance and RC delay, thus improving the performance of the device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
   a first semiconductor pattern on a substrate, the first semiconductor pattern including an extension pattern protruding from an upper surface of the substrate and a lower channel on the extension pattern;
   a semiconductor oxide layer between the extension pattern and the lower channel;
   a second semiconductor pattern on the first semiconductor pattern and spaced apart from the first semiconductor pattern in a vertical direction, the second semiconductor pattern including an upper channel extending in the vertical direction;
   a gate electrode covering the lower channel and surrounding the upper channel; and source/drain patterns on opposite sides of the upper channel, wherein the substrate and the first semiconductor pattern are not intentionally doped such that the substrate and the first semiconductor pattern have a doping concentration of less than $10^{19}/cm^3$.

2. The semiconductor device as claimed in claim 1, further comprising a gate capping layer covering the gate electrode.

3. The semiconductor device as claimed in claim 2, wherein:
the gate electrode includes an upper intersection between the upper channel and the gate capping layer and a lower intersection between the upper channel and the lower channel, and
a height of the upper intersection is less than a height of the lower intersection.

4. The semiconductor device as claimed in claim 3, wherein a height of the gate electrode between the upper channel and the gate capping layer is 50 nm or less.

5. The semiconductor device as claimed in claim 3, wherein a horizontal width of the lower intersection is greater than a horizontal width of the upper intersection.

6. The semiconductor device as claimed in claim 3, wherein a horizontal width of the lower intersection is less than a horizontal width of the upper intersection.

7. The semiconductor device as claimed in claim 2, further comprising:
an interlayer insulating layer on the gate capping layer; and
a contact vertically penetrating the interlayer insulating layer and connected to the source/drain patterns.

8. The semiconductor device as claimed in claim 1, further comprising insulating patterns between the first semiconductor pattern and the second semiconductor pattern, the insulating patterns overlapping the source/drain patterns in the vertical direction.

9. The semiconductor device as claimed in claim 8, wherein the insulating patterns completely fill a space between the first semiconductor pattern and the second semiconductor pattern.

10. The semiconductor device as claimed in claim 1, wherein the second semiconductor pattern includes:
a plurality of upper channels spaced apart from each other in the vertical direction; and
an inner spacer between the plurality of upper channels, the inner spacer being in contact with side surfaces of the source/drain patterns.

11. The semiconductor device as claimed in claim 1, further comprising a buried insulating layer between the substrate and the lower channel,
wherein the lower channel is spaced apart from the substrate in the vertical direction.

12. The semiconductor device as claimed in claim 1, wherein an upper surface of the gate electrode is positioned at a lower level than an upper surface of the upper channel.

13. The semiconductor device as claimed in claim 12, further comprising a gate insulating layer surrounding the upper channel between the gate electrode and the upper channel,
wherein a height from the upper surface of the gate electrode to an upper surface of the gate insulating layer in the vertical direction is 10 nm or less.

14. A semiconductor device, comprising:
a first semiconductor pattern on a substrate, the first semiconductor pattern including an extension pattern protruding from an upper surface of the substrate and a lower channel on the extension pattern;
a semiconductor oxide layer between the extension pattern and the lower channel;
a device isolation layer covering the substrate and the semiconductor oxide layer;
a second semiconductor pattern on the first semiconductor pattern and spaced apart from the first semiconductor pattern in a vertical direction, the second semiconductor pattern including an upper channel extending in the vertical direction;
a gate electrode covering the lower channel and surrounding the upper channel;
a gate capping layer covering the gate electrode; and
source/drain patterns on opposite sides of the upper channel,
wherein the substrate and the first semiconductor pattern have a doping concentration of $10^{19}/cm^3$ or less.

15. The semiconductor device as claimed in claim 14, wherein the semiconductor oxide layer includes SiGeO.

16. The semiconductor device as claimed in claim 14, wherein an upper surface of the device isolation layer is positioned between an upper surface of the lower channel and a lower surface of the lower channel.

17. A method of manufacturing a semiconductor device, the method comprising:
forming an active pattern including:
a first semiconductor pattern on a substrate such that the first semiconductor pattern includes an extension pattern protruding from an upper surface of the substrate and a lower channel on the extension pattern,
a semiconductor oxide layer between the extension pattern and the lower channel,
a sacrificial pattern on the first semiconductor pattern, and
a second semiconductor pattern on the sacrificial pattern, the active pattern extending in a first horizontal direction;
forming a preliminary gate pattern extending in a second horizontal direction, intersecting the first horizontal direction, across the active pattern;
forming a cavity by removing a portion of the sacrificial pattern that does not overlap the preliminary gate pattern in a vertical direction;
forming an insulating pattern filling the cavity and gate spacers covering a sidewall of the preliminary gate pattern;
forming source/drain patterns on the second semiconductor pattern; and
replacing the preliminary gate pattern with a gate electrode,
wherein the substrate and the first semiconductor pattern are not intentionally doped such that the substrate and the first semiconductor pattern have a doping concentration of less than $10^{19}/cm^3$.

18. The method as claimed in claim 17, wherein the first semiconductor pattern, the sacrificial pattern, and the second semiconductor pattern are epitaxially grown from the substrate.

19. The method as claimed in claim 17, wherein replacing the preliminary gate pattern with the gate electrode includes:
removing the preliminary gate pattern and the sacrificial pattern; and
forming the gate electrode between the gate spacers.

* * * * *